US012581995B2

(12) United States Patent
Jang et al.

(10) Patent No.: US 12,581,995 B2
(45) Date of Patent: Mar. 17, 2026

(54) LIGHT EMITTING DISPLAY PANEL

(71) Applicant: LG Display Co., Ltd., Seoul (KR)

(72) Inventors: Hun Jang, Paju-si (KR); Ji-Heun Lee, Paju-si (KR); Soyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 366 days.

(21) Appl. No.: 17/523,905

(22) Filed: Nov. 10, 2021

(65) Prior Publication Data

US 2022/0208804 A1  Jun. 30, 2022

(30) Foreign Application Priority Data

Dec. 24, 2020  (KR) ........................ 10-2020-0183376

(51) Int. Cl.
*H01L 25/16* (2023.01)
*H10D 86/40* (2025.01)
(Continued)

(52) U.S. Cl.
CPC .......... *H10W 90/00* (2026.01); *H10D 86/481* (2025.01); *H10D 86/60* (2025.01);
(Continued)

(58) Field of Classification Search
CPC . H01L 27/1255; H01L 23/552; H01L 27/156; H10K 59/1216; G09G 3/32; G09G 2300/0426; G09G 2300/0842
(Continued)

(56) References Cited

U.S. PATENT DOCUMENTS 9,269,757 B2  2/2016  Kim et al.
9,324,740 B2  4/2016  Lee et al.
(Continued)

FOREIGN PATENT DOCUMENTS

CN  101978505 A  2/2011
CN  104733499 A  6/2015
(Continued)

OTHER PUBLICATIONS

Ministry of Intellectual Property of Korea, Office Action, Korean Patent Application No. 10-2020-0183376, Jan. 15, 2026, 21 pages.
(Continued)

*Primary Examiner* — Ori Nadav
(74) *Attorney, Agent, or Firm* — Fenwick & West LLP

(57) ABSTRACT

A light emitting display panel includes a driving transistor, and a storage capacitor including at least three electrodes to reduce a size of the driving transistor or the storage capacitor. The light emitting display panel comprises a light emitting element, the driving transistor connected to the light emitting element, and the storage capacitor connected to a gate and a first electrode of the driving transistor. The driving transistor includes a light shielding electrode used as the gate of the driving transistor, a buffer covering the light shielding electrode, an active portion provided on an upper surface of the buffer, forming the first electrode, a second electrode and a semiconductor portion of the driving transistor, a gate insulating layer covering the active portion, and a gate electrode provided on an upper surface of the gate insulating layer and connected to the light shielding electrode.

12 Claims, 23 Drawing Sheets

(51) Int. Cl.

| | |
|---|---|
| *H10D 86/60* | (2025.01) |
| *H10W 90/00* | (2026.01) |
| *G09G 3/32* | (2016.01) |
| *H10H 29/14* | (2025.01) |
| *H10K 59/12* | (2023.01) |
| *H10K 59/121* | (2023.01) |
| *H10K 59/131* | (2023.01) |
| *H10W 42/20* | (2026.01) |

(52) U.S. Cl.

CPC ....... *G09G 3/32* (2013.01); *G09G 2300/0426* (2013.01); *G09G 2300/0842* (2013.01); *H10H 29/142* (2025.01); *H10K 59/12* (2023.02); *H10K 59/1216* (2023.02); *H10K 59/131* (2023.02); *H10W 42/20* (2026.01)

(58) Field of Classification Search

USPC ......................................................... 257/71
See application file for complete search history.

(56) References Cited

U.S. PATENT DOCUMENTS

| | | | |
|---|---|---|---|
| 9,941,169 | B2 | 4/2018 | Lee et al. |
| 10,629,488 | B2 | 4/2020 | Lee et al. |
| 10,985,068 | B2 | 4/2021 | Lee et al. |
| 2002/0135549 | A1* | 9/2002 | Kawata ............. G02F 1/136209 |
| | | | 257/E27.111 |
| 2007/0029613 | A1 | 2/2007 | Moriwaki |
| 2011/0012880 | A1* | 1/2011 | Tanaka ................. G09G 3/3677 |
| | | | 257/E29.345 |
| 2015/0179724 | A1 | 6/2015 | Lee et al. |
| 2015/0187861 | A1 | 7/2015 | Kim et al. |
| 2016/0204180 | A1* | 7/2016 | Lee ................... H01L 21/28008 |
| | | | 438/23 |
| 2017/0365649 | A1 | 12/2017 | Kim et al. |
| 2018/0175077 | A1 | 6/2018 | Koo et al. |
| 2018/0197779 | A1 | 7/2018 | Lee et al. |
| 2020/0219770 | A1 | 7/2020 | Lee et al. |

FOREIGN PATENT DOCUMENTS

| | | | |
|---|---|---|---|
| CN | 108206010 | A | 6/2018 |
| KR | 10-2015-0066428 | A | 6/2015 |
| KR | 10-2015-0073611 | A | 7/2015 |
| KR | 10-2015-0076391 | A | 7/2015 |
| KR | 10-2015-0078344 | A | 7/2015 |
| KR | 10-2015-0100462 | A | 9/2015 |
| KR | 10-2017-0078075 | A | 7/2017 |
| KR | 10-2017-0143082 | A | 12/2017 |
| KR | 10-2019-0080346 | A | 7/2019 |
| KR | 10-2020-0079740 | A | 7/2020 |

OTHER PUBLICATIONS

China National Intellectual Property Administration, Office Action, Chinese Patent Application No. 202111306392.0, Jan. 13, 2026, 32 pages.

* cited by examiner 151    152    153    154

151    152    153    154

PLA

112d

112a

115d

114

115c

CH5

118d

118a 151     152     153     154

160

161

LIGHT EMITTING DISPLAY PANEL

CROSS-REFERENCE TO RELATED APPLICATIONS

This application claims priority to Republic of Korea Patent Application No. 10-2020-0183376 filed on Dec. 24, 2020, which is incorporated herein by reference in its entirety.

BACKGROUND

Field of the Disclosure

The present disclosure relates to a light emitting display panel.

Discussion of the Related Art

A pixel constituting a light emitting display panel includes a light emitting element, transistors, and capacitors for driving the light emitting element.

In order to solve a problem of degraded light emitting elements, a number of transistors provided in a pixel and a size of the transistors are increased. In addition, in order to increase charging efficiency of a capacitor, a size of the capacitor has been increased.

The increase in the size of the transistor means that a size of a conductor (electrode) constituting the transistor is increased, and the increase in the size of the capacitor means that the size of the conductor constituting the capacitor is increased.

The conductor constituting a transistor and a capacitor is formed of an opaque conductor in consideration of conductivity and the like. Therefore, when the size of the conductor provided in the pixel is increased, a size of an opening through which light generated from the light emitting element provided in the pixel is emitted to the outside is reduced.

SUMMARY

The present disclosure has been made in view of the above problems and it is an object of the present disclosure to provide a light emitting display panel in which a driving transistor is provided in a dual gate type or a storage capacitor is provided using at least three electrodes to reduce a size of the driving transistor or the storage capacitor.

In one embodiment, a light emitting display panel includes a light emitting element provided in a pixel, a driving transistor connected to the light emitting element, and a storage capacitor connected to a gate and a first electrode of the driving transistor. The driving transistor includes a light shielding electrode on a substrate, and the light shielding electrode is used as the gate of the driving transistor. The light shielding electrode of the driving transistor is covered by a buffer, and an active portion including the first electrode, a second electrode, and a semiconductor portion is provided on an upper surface of the buffer. A gate insulating layer covers at least a portion of the active portion, and a gate electrode is provided on an upper surface of the gate insulating layer, connected with the light shielding electrode, and used as the gate of the driving transistor. An electrode of the storage capacitor is connected to at least one of the light shielding electrode and the gate electrode.

In one embodiment, a light emitting display panel includes a light emitting element provided in a pixel, a driving transistor connected to the light emitting element, and a storage capacitor connected to a gate electrode and a first electrode of the driving transistor. The storage capacitor includes at least three electrodes provided in their respective layers different from one another.

In one embodiment, a light emitting display panel includes a light emitting element, a driving transistor for driving the light emitting element, a light shielding electrode on a substrate, and a storage capacitor electrically connected to the driving transistor. The driving transistor includes an active portion including a first electrode, a second electrode, and a semiconductor portion. A gate insulating layer is on the active portion, and a gate electrode is disposed on at least a portion of the gate insulating layer. The storage capacitor includes at least one capacitor electrode that extends from the first electrode of the active portion of the driving transistor, the gate electrode of the driving transistor, or the light shielding electrode.

In one embodiment, a light emitting display panel includes a light emitting element, a driving transistor for driving the light emitting element, a light shielding electrode on a substrate, and a storage capacitor. The driving transistor includes an active portion including a first electrode, a second electrode, and a semiconductor portion. At least a part of a gate insulating layer is on the active portion, and a gate electrode is disposed on the part of the gate insulating layer. The storage capacitor includes an active capacitor electrode spaced apart from the active portion of the driving transistor and a gate capacitor electrode on the active capacitor electrode to form a first capacitor, where the gate capacitor electrode extends to contact a portion of the active portion of the driving transistor through a contact hole in the gate insulating layer.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display panel comprising a light emitting element provided in a pixel, a driving transistor connected with the light emitting element, and a storage capacitor provided between a gate and a first electrode of the driving transistor, wherein the driving transistor includes a light shielding electrode provided on a substrate and used as the gate of the driving transistor, a buffer covering the light shielding electrode, an active portion provided on an upper surface of the buffer, forming the first electrode, a second electrode and a semiconductor portion of the driving transistor, a gate insulating layer covering the active portion, and a gate electrode provided on an upper surface of the gate insulating layer, connected with the light shielding electrode and used as the gate of the driving transistor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
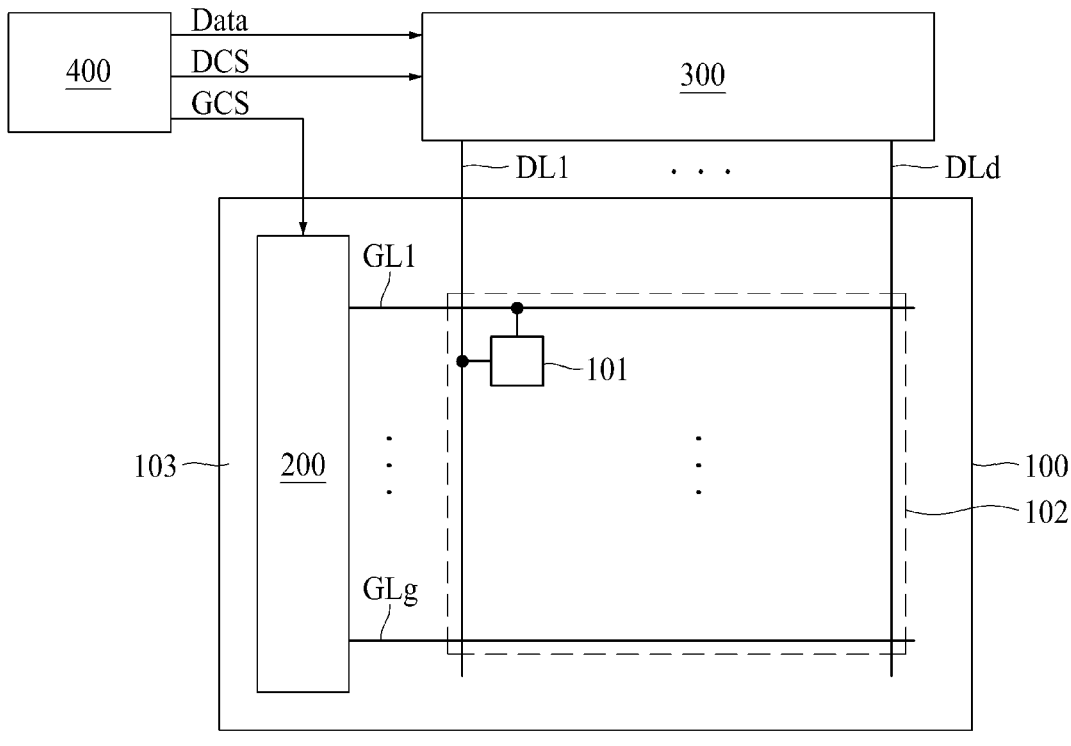
FIG. 1 is an exemplary view illustrating a structure of a light emitting display apparatus to which a light emitting display panel is applied, according to an embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

In the drawings, the same or similar elements are denoted by the same reference numerals even though they are depicted in different drawings. Wherever possible, the same reference numbers will be used throughout the drawings to refer to the same or like parts.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It should be understood that the term "at least one" includes all combinations related with any one item. For example, "at least one among a first element, a second element and a third element" may include all combinations of two or more elements selected from the first, second and third elements as well as each element of the first, second and third elements.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the embodiment of the present disclosure will be described in detail with reference to the accompanying drawings.

Figure 2:
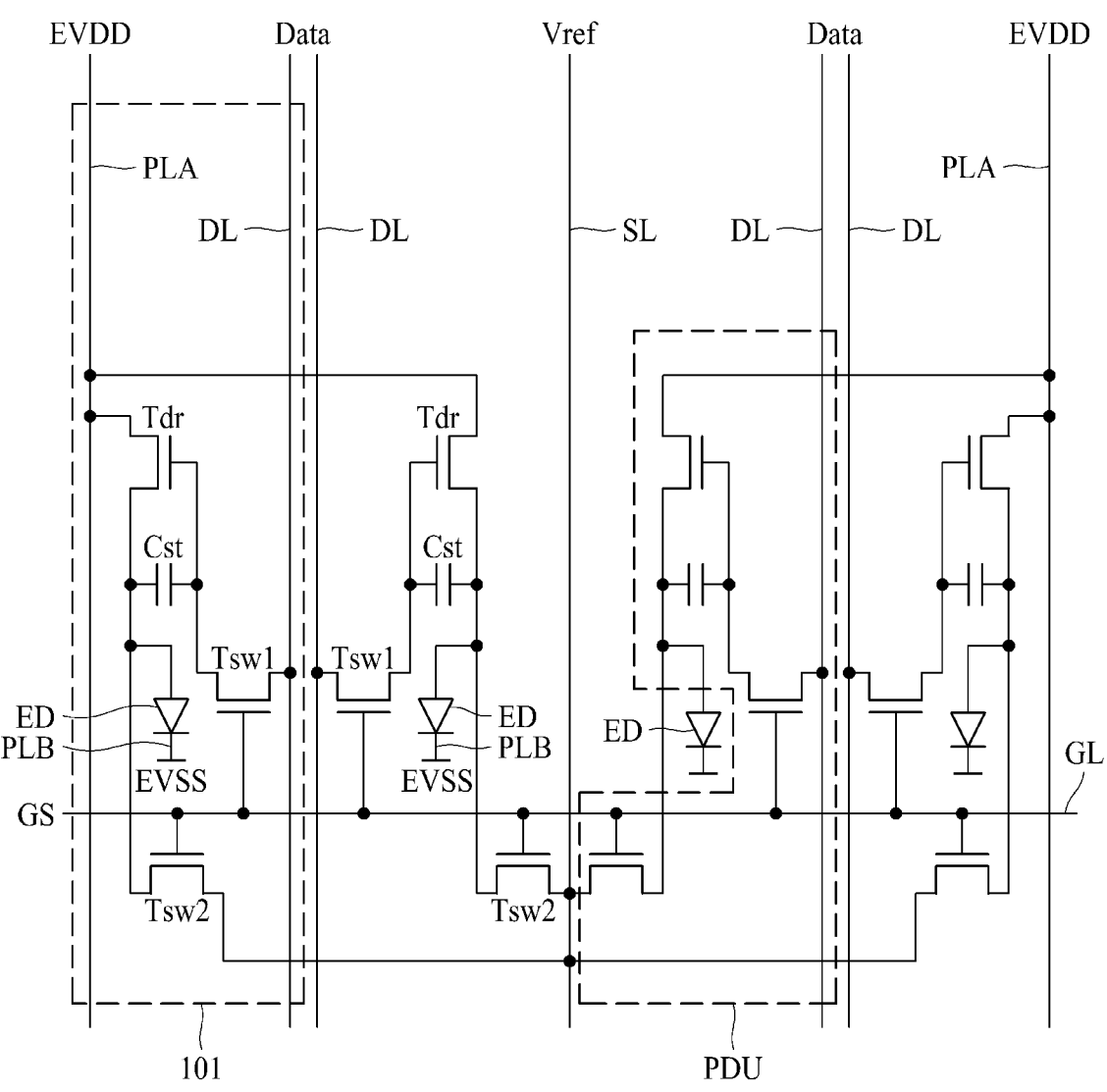
FIG. 2 is an exemplary view illustrating a structure of a pixel applied to a light emitting display panel, according to an embodiment of the present disclosure.

FIG. 1 is an exemplary view illustrating a structure of a light emitting display apparatus to which a light emitting display panel is applied, according to an embodiment of the present disclosure. FIG. 2 is an exemplary view illustrating a structure of a pixel applied to a light emitting display panel, according to an embodiment of the present disclosure.

The light emitting display apparatus according to the present disclosure may constitute various electronic devices. The electronic device may be, for example, a smart phone, a tablet PC, a television, a monitor, or the like.

As shown in FIG. 1, the light emitting display apparatus according to the present disclosure includes a light emitting display panel 100 including a display area 102, on which an image is output, and a non-display area 103 provided outside the display area 102, a gate driver 200 for supplying a gate signal to gate lines GL1 to GLg provided in the display area 102 of the light emitting display panel 100, a data driver 300 for supplying data voltages to data lines DL1 to DLd provided in the light emitting display panel 100, and a controller 400 for controlling driving of the gate driver 200 and the data driver 300.

First of all, the light emitting display panel 100 includes a display area 102 and a non-display area 103. The display area 102 is provided with gate lines GL1 to GLg, data lines DL1 to DLd, voltage supply lines PLA and pixels 101.

As shown in FIG. 2, the pixel 101 provided in the light emitting display panel 100 may include a light emitting element ED, a switching transistor Tsw1, a storage capacitor Cst, a driving transistor Tdr, and a sensing transistor Tsw2. That is, the pixel 101 may include a pixel driving unit PDU and a light emitting unit, wherein the pixel driving unit PDU may include a switching transistor Tsw1, a capacitor Cst, a driving transistor Tdr and a sensing transistor Tsw2, and the light emitting unit may include a light emitting element ED.

The light emitting element ED may include any one of an organic light emitting layer, an inorganic light emitting layer and a quantum dot light emitting layer, or may include a deposited or mixed structure of an organic light emitting layer (or inorganic light emitting layer), and a quantum dot light emitting layer.

The switching transistor Tsw1 constituting the pixel driving unit PDU may be turned on or off by a gate signal GS supplied to the gate line GL, and a data voltage Vdata supplied through the data line DL is supplied to the driving transistor Tdr when the switching transistor Tsw1 is turned on. A first voltage EVDD may be supplied to the driving transistor Tdr and the light emitting element ED through a first voltage supply line PLA. A second voltage EVSS is supplied to the light emitting element ED through a second voltage supply line PLB. The sensing transistor Tsw2 may be turned on or off by a sensing control signal supplied through a sensing control line. In some embodiments, the sensing control line may be provided separately from the gate line GL. In the embodiment illustrated in FIG. 2, the gate line GL is the sensing control line. In this case, the gate signal GS may be the sensing control signal. A sensing line SL may be connected to the sensing transistor Tsw2. A reference voltage Vref may be supplied to the pixel 101 through the sensing line SL, and a sensing signal related to a characteristic change of the driving transistor Tdr may be transmitted to the sensing line SL through the sensing transistor Tsw2.

The light emitting display panel 100 according to the present disclosure may be formed in the structure shown in FIG. 2, but the present disclosure is not limited thereto. Therefore, the light emitting display panel 100 according to the present disclosure may be changed in various forms in addition to the structure shown in FIG. 2.

In the light emitting display panel 100, signal lines for supplying various signals to the pixel driving unit PDU provided in the pixel 101 are formed.

For example, in the light emitting display panel 100 that includes the pixel 101 shown in FIG. 2, signal lines may include a gate line GL, a data line DL, a first voltage supply line PLA, a second voltage supply line PLB, and a sensing line SL.

The data driver 300 may be provided in a chip-on film attached to the light emitting display panel 100, and may also be connected to a main substrate provided with the controller 400. In this case, lines for electrically connecting the data driver 300 with the light emitting display panel 100 may be provided in the chip-on-film. To this end, the lines are electrically connected to pads provided in the main substrate and the light emitting display panel 100. The main substrate is electrically connected with an external substrate on which an external system is mounted.

The data driver 300 may be directly mounted on the light emitting display panel 100 and then electrically connected with the main substrate.

However, the data driver 300 may be formed as one integrated circuit together with the controller 400. The integrated circuit may be provided in the chip-on film or directly mounted on the light emitting display panel 100.

The data driver 300 may receive a sensing signal related to the characteristic change of the driving transistor Tdr provided in the light emitting display panel 100 from the light emitting display panel 100 and transmit the sensing signal to the controller 400.

Next, the external system serves to drive the controller 400 and the electronic device. For example, when the electronic device is a smart phone, the external system may receive various kinds of voice information, image information and text information through a wireless communication network and transmit the received image information to the controller 400. The image information may be input image data.

Then, the gate driver 200 may be provided as an integrated circuit and then mounted on the non-display area 103, or may directly be embedded in the non-display area 103 using a gate-in-panel (GIP) scheme. When the gate-in-panel scheme is used, the transistors constituting the gate driver 200 may be provided in the non-display area 103 through the same process as that of the transistors provided in the respective pixels 101 of the display area 102.

When the gate pulse generated by the gate driver 200 is supplied to a gate of the switching transistor Tsw1 provided in the pixel 101, the switching transistor Tsw1 is turned on. When a gate-off signal is supplied to the switching transistor Tsw1, the switching transistor Tsw1 is turned off. The gate signal GS supplied to the gate line GL includes a gate pulse and a gate-off signal.

Finally, the controller 400 may realign input image data transmitted from the external system by using a timing synchronization signal transmitted from the external system. Also, the controller 400 may include a data aligner for supplying the realigned image data Data to the data driver 300, a control signal generator for generating a gate control signal GCS and a data control signal DCS using the timing synchronization signal, an input unit for receiving the timing synchronization signal and the input image data transmitted from the external system and transmitting them to the data aligner and the control signal generator, and an output unit for outputting the image data Data generated from the data aligner and the control signals DCS and GCS generated from the control signal generator to the data driver 300 or the gate driver 200.

Hereinafter, a light emitting display panel 100 having the pixels 101 shown in FIG. 2 will be described as an example of a light emitting display panel 100 according to the present disclosure.

Figure 3:
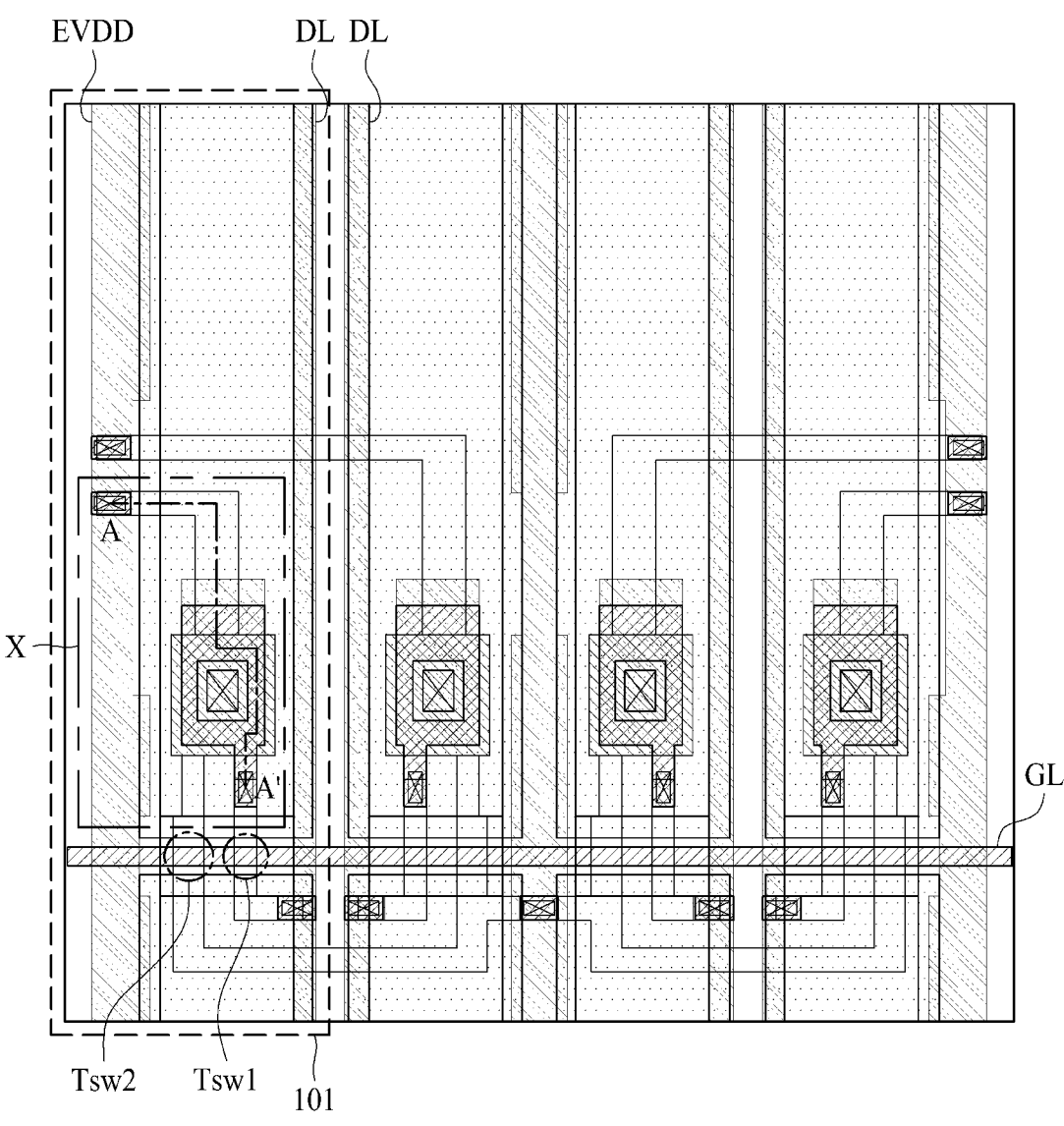
FIG. 3 is an exemplary view illustrating four pixels of a light emitting display panel, according to an embodiment of the present disclosure.
Figure 4:
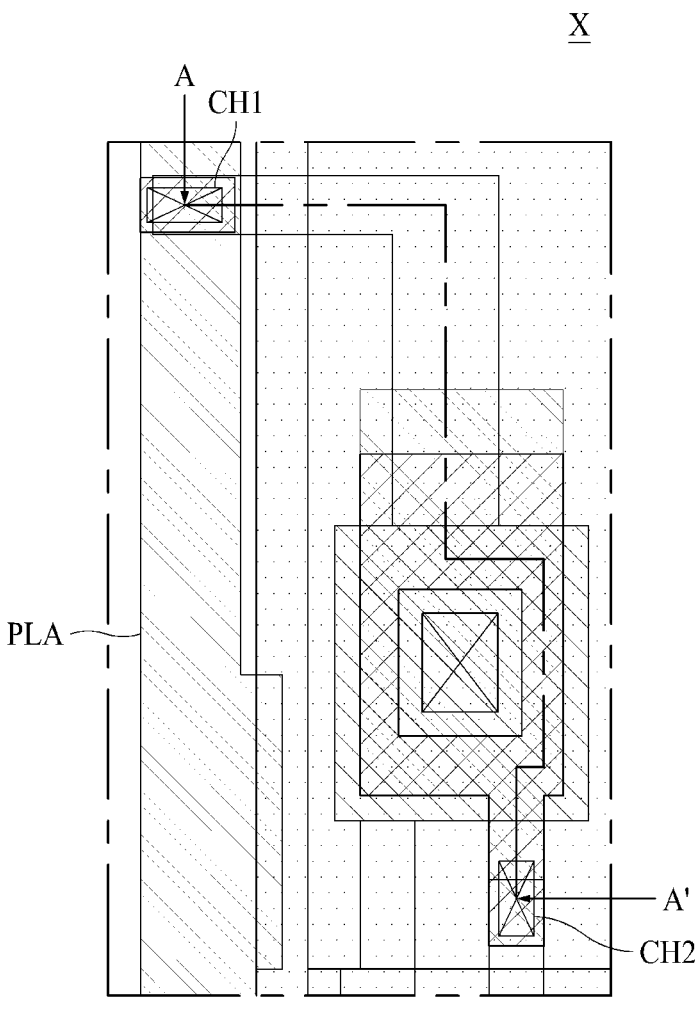
FIG. 4 is an enlarged exemplary view illustrating an area X shown in FIG. 3, according to an embodiment of the present disclosure.

FIG. 3 is an exemplary view illustrating four pixels of a light emitting display panel according to an embodiment of the present disclosure. FIG. 4 is an enlarged exemplary view illustrating an area X shown in FIG. 3, according to an embodiment of the present disclosure. FIGS. 5A to 5H are exemplary views illustrating a method of manufacturing pixels shown in FIG. 3, according to an embodiment of the present disclosure. FIG. 6A is an exemplary view illustrating a cross-section taken along line A-A' shown in FIGS. 3 and 4, according to an embodiment of the present disclosure. FIG. 6B is an exemplary view illustrating transistors and capacitors in the cross-section shown in FIG. 6A, according to an embodiment of the present disclosure.

As shown in FIGS. 2 and 3, the light emitting display panel according to the present disclosure includes a light emitting element ED provided in a pixel, a driving transistor Tdr connected with the light emitting element ED and a storage capacitor Cst provided between a gate of the driving transistor Tdr and a first electrode of the driving transistor.

A method of manufacturing the light emitting display panel will be described with reference to FIGS. 2 to 6B.

Figure 5A:
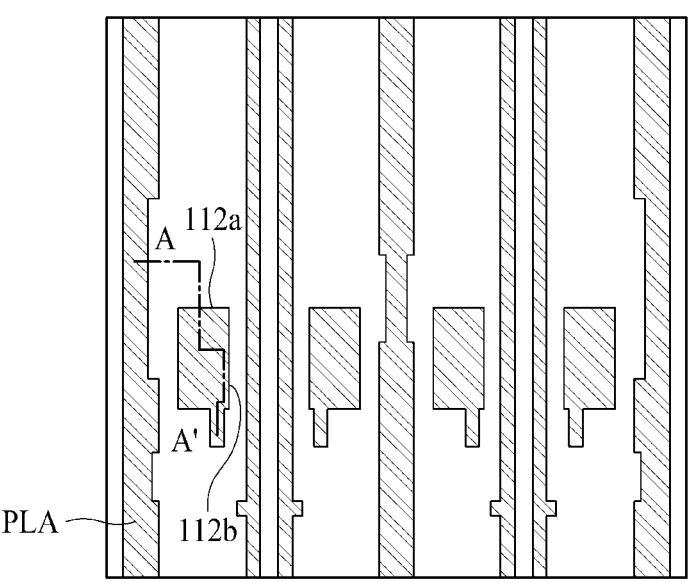
FIGS. 5A to 5H are exemplary views illustrating a method of manufacturing pixels shown in FIG. 3, according to an embodiment of the present disclosure.
Figure 6A:
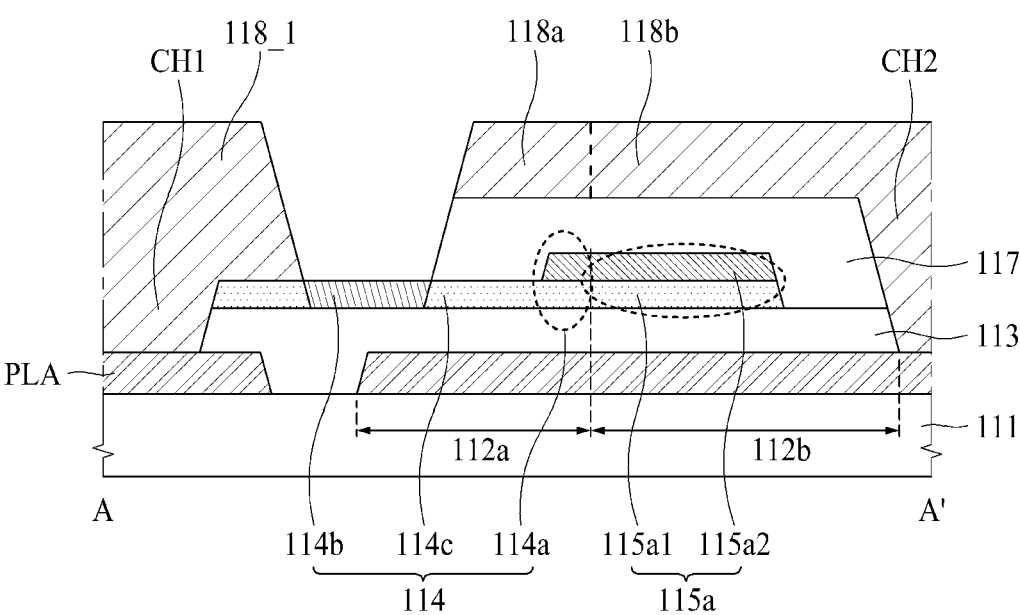
FIG. 6A is an exemplary view illustrating a cross-section taken along line A-A' shown in FIGS. 3 and 4, according to an embodiment of the present disclosure.
Figure 6B:
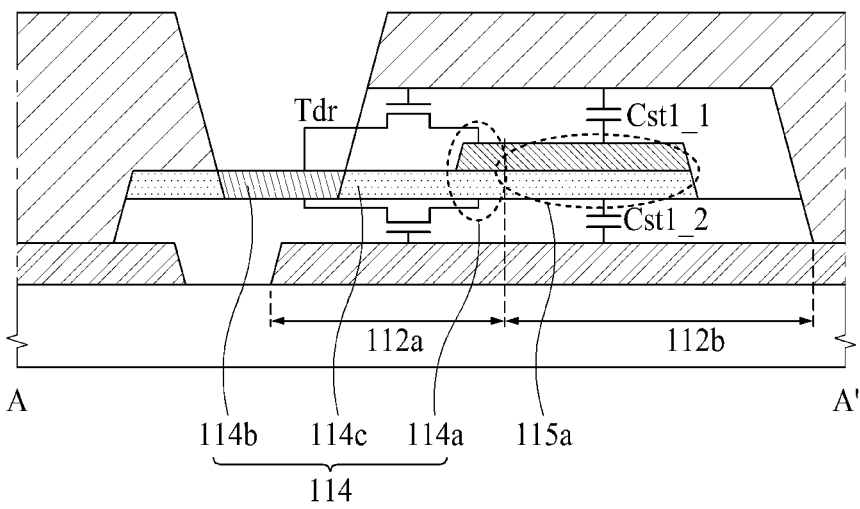
FIG. 6B is an exemplary view illustrating transistors and capacitors in the cross-section shown in FIG. 6A, according to an embodiment of the present disclosure.

First of all, as shown in FIG. 5A, a light shielding layer is provided on an upper surface of a substrate 111.

The light shielding layer may include a light shielding electrode 112a, a first light shielding capacitor electrode 112b, a first voltage supply line PLA and other various electrodes.

Next, the light shielding layer is covered by a buffer 113.

Figure 5B:
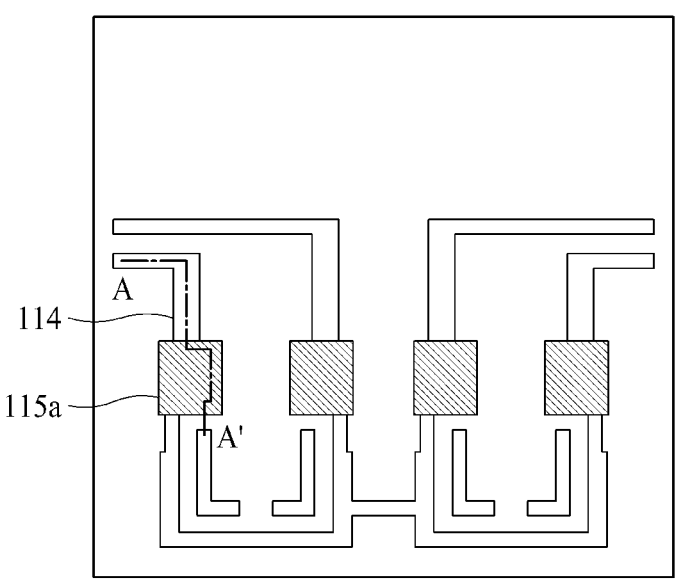

Next, an active layer, as shown in FIG. 5B, is provided on an upper surface of the buffer 113.

The active layer may include an active portion 114, a first active capacitor electrode 115a and other various electrodes.

Figure 5C:
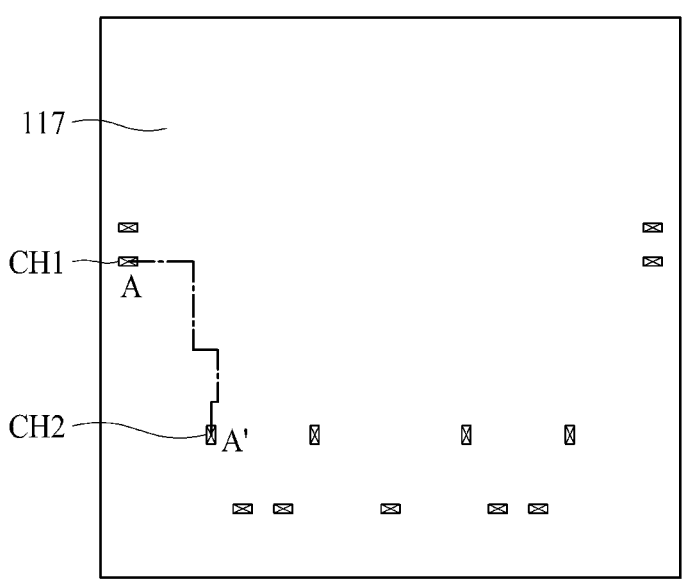

Next, the active layer is covered by a gate insulating layer 117 as shown in FIG. 5C.

In this case, a first contact hole CH1, a second contact hole CH2 and other various contact holes are formed in the gate insulating layer 117.

Figure 5D:
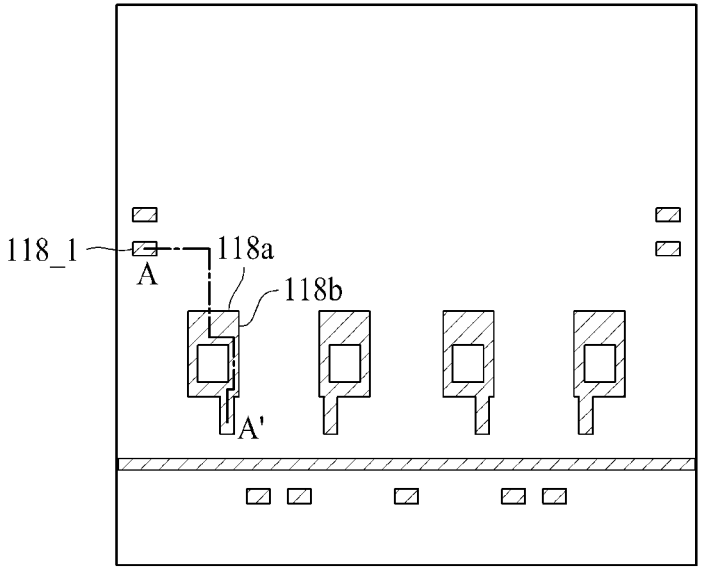

Next, a gate layer, as shown in FIG. 5D, is provided on an upper surface of the gate insulating layer 117.

The gate layer may include a gate electrode 118a, a first gate capacitor electrode 118b, a first contact hole electrode 118_1 and other various electrodes.

Next, the gate layer is covered by a planarization layer.

Figure 5E:
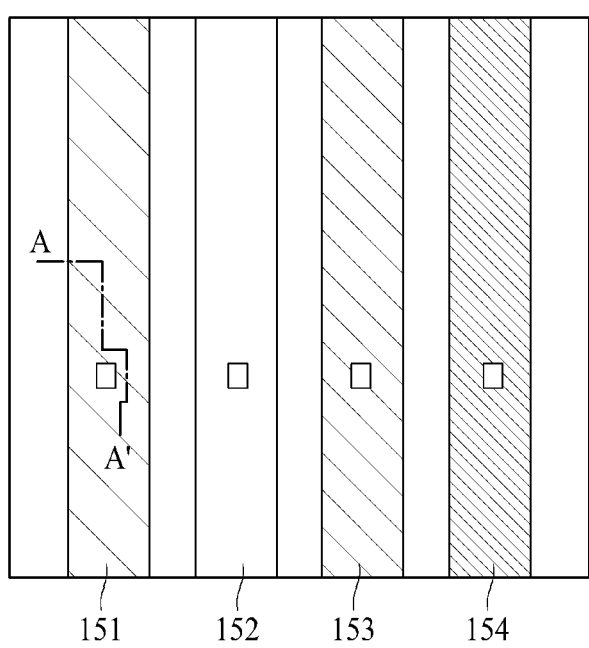

Next, a color filter layer, as shown in FIG. 5E, is provided on an upper surface of the planarization layer.

For example, the color filter layer may include a red color filter 151, a blue color filter 152, a white color filter 153 and a green color filter 154.

Figure 5F:
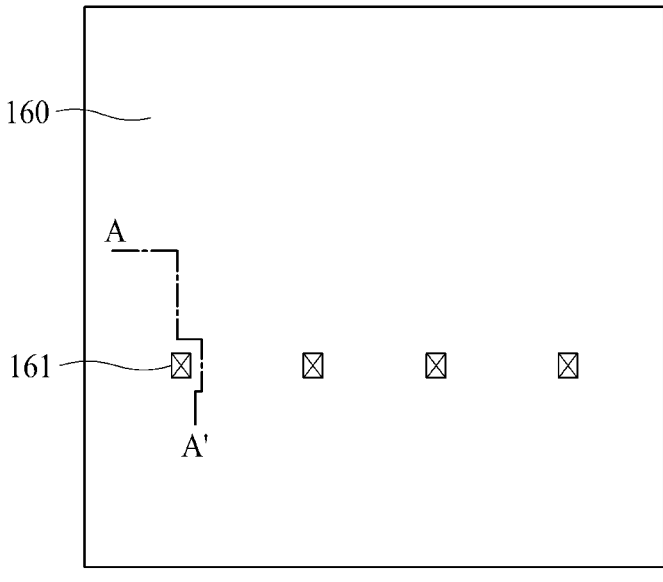

Next, the color filter layer is covered by an overcoating layer 160 as shown in FIG. 5F.

In this case, a pixel contact hole 161 for connecting a first electrode 114a of the driving transistor Tdr with an anode electrode may be formed in the overcoating layer 160. The pixel contact hole 161 may pass through the planarization layer and the gate insulating layer 117.

Figure 5G:
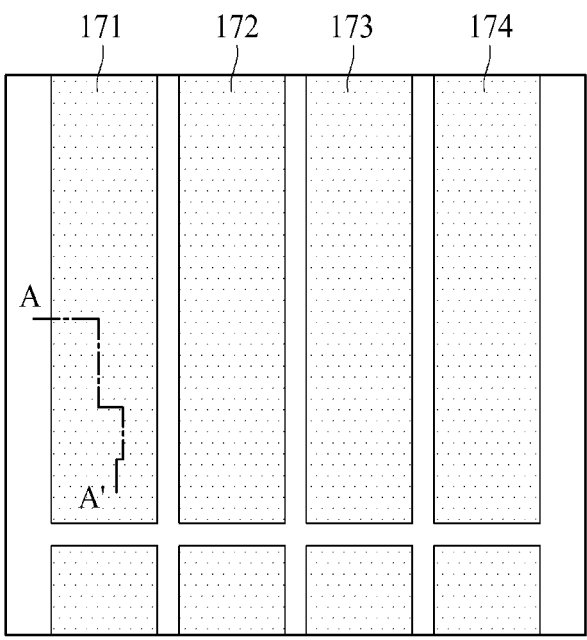

Next, an anode electrode layer, as shown in FIG. 5G, is provided on an upper surface of the overcoating layer 160.

The anode electrode layer may include a red anode electrode 171 provided in a red pixel, a blue anode electrode 172 provided in a blue pixel, a white anode electrode 173 provided in a white pixel and a green anode electrode 174 provided in a green pixel.

Figure 5H:
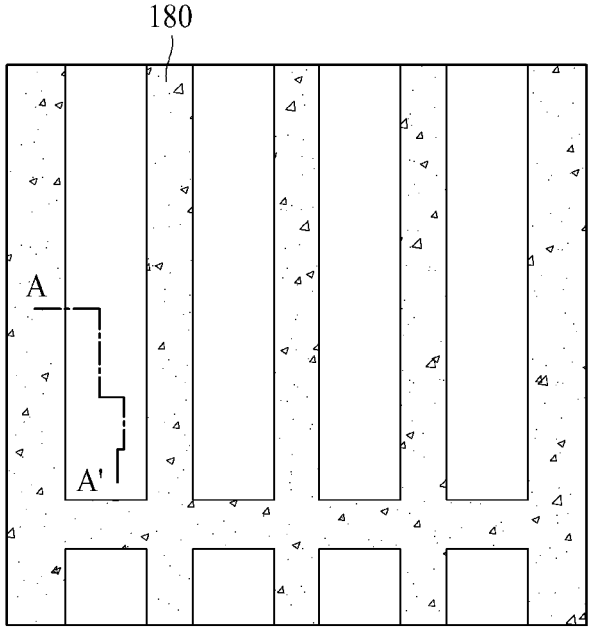

Next, a bank 180 as shown in FIG. 5H is provided on an upper surface of the anode electrode layer.

The bank 180 is formed to surround an outer periphery of the anode electrodes 171 to 174 constituting the anode electrode layer. Therefore, the anode electrodes 171 to 174 are exposed through an area in which the bank 180 is not provided.

Next, a light emitting layer is provided on an upper surface of the anode electrodes 171 to 174.

Next, a cathode electrode is provided in a display area of the substrate to cover the light emitting layer.

Finally, the cathode electrode is covered by an encapsulation layer.

Features of the light emitting display panel according to the present disclosure, which is manufactured through the above-described manufacturing process, will be described below.

The driving transistor Tdr, as shown in FIG. 6A, includes a light shielding electrode 112a used as a gate of the driving transistor and provided in the substrate 111, a buffer 113 covering the light shielding electrode 112a, an active portion 114 provided on an upper surface of the buffer 113, forming a first electrode 114a, a second electrode 114b and a semi-conductor portion 114c of the driving transistor Tdr, a gate insulating layer 117 covering the active portion 114, and a gate electrode 118a provided on an upper surface of the gate insulating layer 117, connected with the light shielding electrode 112a and used as the gate of the driving transistor Tdr. The driving transistor Tdr has a dual gate structure with the gate electrode 118a being used as a first gate and the light shielding electrode 112a being used as a second gate.

The storage capacitor Cst includes a first active capacitor electrode 115a extended from the first electrode 114a of the active portion 114, a first gate capacitor electrode 118b extended from the gate electrode 118a and overlapped with the first active capacitor electrode 115a, and a first light shielding capacitor electrode 112b extended from the light shielding electrode 112a and overlapped with the first active capacitor electrode 115a. The gate insulating layer 117 on the active portion 114 extends to cover a side surface of the first active capacitor electrode 115a of the storage capacitor Cst.

The first electrode 114a of the driving transistor Tdr and the first active capacitor electrode 115a are integrally formed. That is, as shown in FIGS. 6a and 6b, the first electrode 114a and the first active capacitor electrode 115a are continuously formed, and are formed of the same material.

The gate electrode 118a that forms the gate of the driving transistor Tdr and the first gate capacitor electrode 118b that forms the storage capacitor Cst are integrally formed.

Each of the first electrode 114a and the first active capacitor electrode 115a includes a first reference electrode 115a1 extended from the semiconductor portion 114c of the active portion 114 and a second reference electrode 115a2 provided on an upper surface of the first reference electrode 115a1.

The first reference electrode 115a1 may be formed of the same material as that of the semiconductor portion 114c. For example, the first reference electrode 115a1 may be an IGZO comprised of indium, gallium, zinc and oxygen.

The second reference electrode 115a2 may be formed of a metal material. For example, the second reference electrode 115a2 may be an alloy (MoTi) comprised of molybdenum and titanium.

The first gate capacitor electrode 118b and the first light shielding capacitor electrode 112b are connected to each other through the second contact hole CH2.

The storage capacitor Cst includes at least three electrodes provided in their respective layers different from one another.

For example, as shown in FIG. 6B, the storage capacitor Cst includes a (1-1)th capacitor Cst1_1 comprised of a first active capacitor electrode 115a and a first gate capacitor electrode 118b that extends from the gate electrode 118a of the driving transistor Tdr to overlap with the first active capacitor electrode 115. The storage capacitor Cst also includes a (1-2)th capacitor Cst1_2 comprised of the first active capacitor electrode 115a and a first light shielding capacitor electrode 112b that extends from the light shield-ing electrode 112a to overlap with the first active capacitor electrode 115a.

According to the present disclosure described as above, the light shielding electrode 112a and the gate electrode 118a, which are provided in their respective layers different from each other, are used as the gate of the driving transistor Tdr. That is, the semiconductor portion 114c of the driving transistor Tdr applied to the present disclosure may be driven by the light shielding electrode 112a and the gate electrode 118a.

Therefore, the driving transistor Tdr applied to the present disclosure includes only one of the light shielding electrode 112a and the gate electrode 118a, which are used as the gate of the driving transistor Tdr, and may have the same or similar performance as or to that of a conventional driving transistor having a size larger than that of the driving transistor applied to the present disclosure.

Therefore, the driving transistor applied to the present disclosure may have the same or similar performance as or to that of the conventional driving transistor even though the driving transistor applied to the present disclosure is formed to have a small size compared to the conventional driving transistor. Therefore, according to the present disclosure, the size of electrodes constituting the driving transistor Tdr may be reduced, whereby an aperture ratio of the light emitting display panel may be increased.

According to the present disclosure described as above, the storage capacitor Cst includes a (1-1)th capacitor Cst1_1 and a (1-2)th capacitor Cst1_2, which are connected in parallel. Therefore, when compared to the conventional storage capacitor formed by two electrodes facing each other, the storage capacitor Cst applied to the present dis-closure may form the same or similar capacitance as or to that of the conventional capacitor at a size smaller than that of the conventional capacitor. Therefore, a size of an open-ing may be increased as much as a reduced size of the storage capacitor.

In addition, the (1-1)th capacitor Cst1_1 includes a first active capacitor electrode 115a and a first gate capacitor electrode 118b, and the (1-2)th capacitor Cst1_2 includes a first active capacitor electrode 115a and a first light shielding capacitor electrode 112b.

In this case, the gate electrode 118a, the first gate capaci-tor electrode 118b, the first light shielding capacitor elec-trode 112b and the light shielding electrode 112a are elec-trically connected with one another, and the first electrode 114a and the first active capacitor electrode 115a are elec-trically connected with each other.

Therefore, first terminals of the (1-1)th capacitor Cst1_1 and the (1-2)th capacitor Cst1_2 are commonly connected to the first electrode 114a, and second terminals thereof are commonly connected to the gate electrode 118a.

That is, the (1-1)th capacitor Cst1_1 and the (1-2)th capacitor Cst1_2 are connected with each other in parallel, and thus the capacitance of the storage capacitor Cst includ-ing the (1-1)th capacitor Cst1_1 and the (1-2)th capacitor Cst1_2 may be larger than the capacitance of the storage capacitor having only one of the (1-1)th capacitor Cst1_1 and the (1-2)th capacitor Cst1_2.

Therefore, the storage capacitor Cst applied to the present disclosure may form the same or similar capacitance as or to that of the conventional capacitor at a size smaller than that of the conventional capacitor, and thus the size of the opening of the light emitting display panel 100 may be increased as much as the reduced size of the storage capaci-tor.

Figure 7:
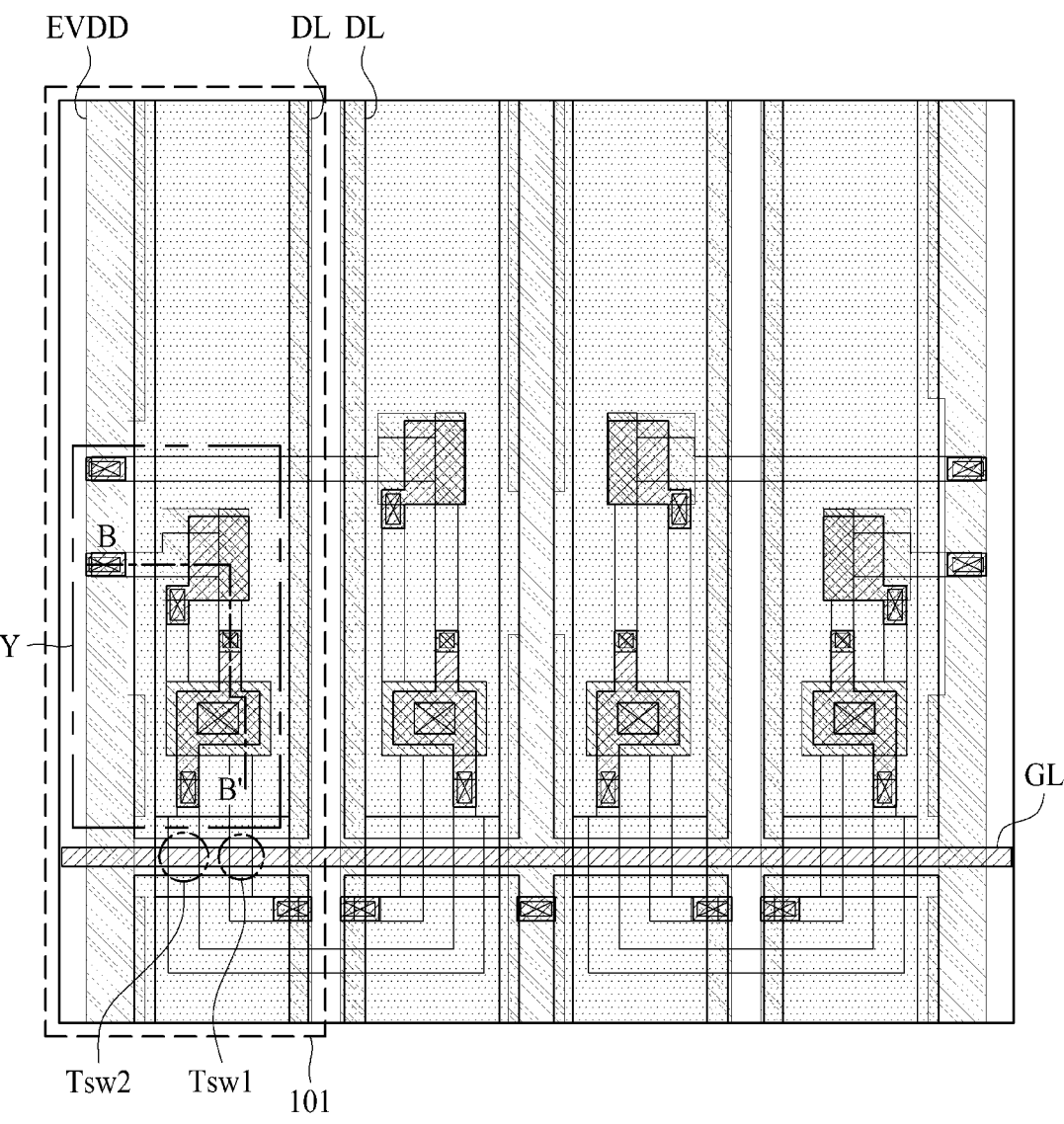
FIG. 7 is another exemplary view illustrating four pixels of a light emitting display panel, according to an embodiment of the present disclosure.
Figure 8:
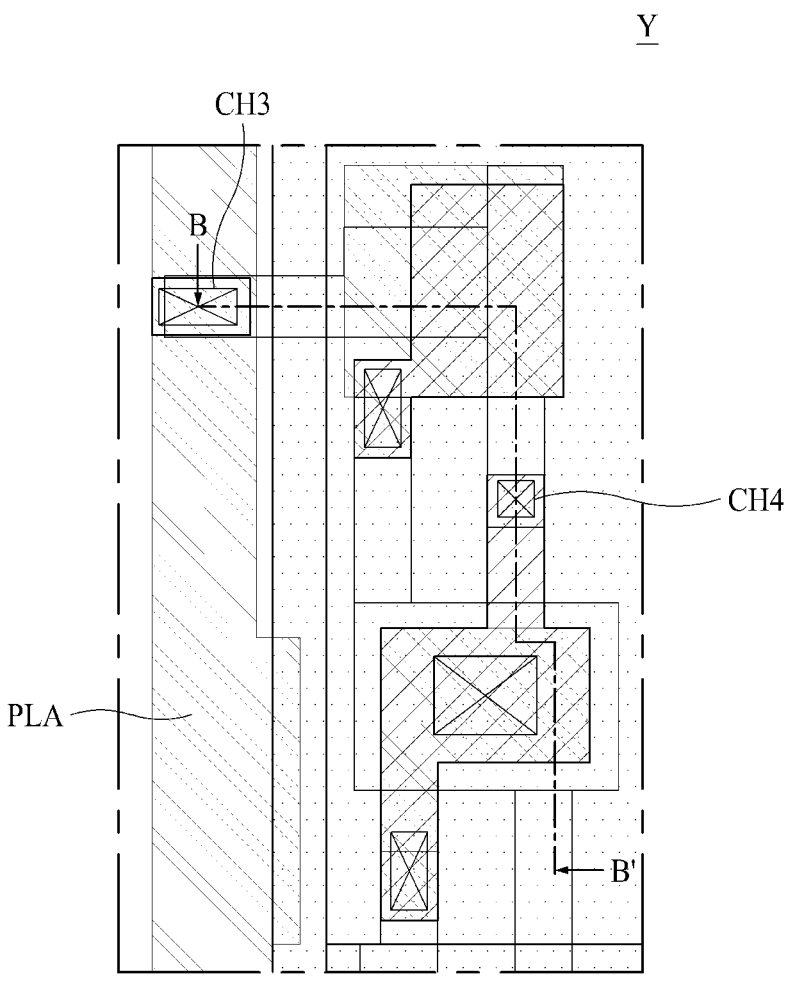
FIG. 8 is an enlarged exemplary view illustrating an area Y shown in FIG. 7, according to an embodiment of the present disclosure.

FIG. 7 is another exemplary view illustrating four pixels of a light emitting display panel, according to an embodi-ment of the present disclosure. FIG. 8 is an enlarged exemplary view illustrating an area Y shown in FIG. 7, according to an embodiment of the present disclosure. FIGS. 9A to 9H are exemplary views illustrating a method of manufacturing pixels shown in FIG. 7, according to an embodiment of the present disclosure. FIG. 10A is an exemplary view illustrating a cross-section taken along line B-B' shown in FIGS. 7 and 8, according to an embodiment of the present disclosure. FIG. 10B is an exemplary view illustrating transistors and capacitors in the cross-section shown in FIG. 10A, according to an embodiment of the present disclosure. In the following description, the same or similar description as or to that described with reference to FIGS. 1 to 6B will be omitted or briefly described.

A method of manufacturing another light emitting display panel according to the present disclosure will be described with reference to FIGS. 7 to 10B.

Figure 9A:
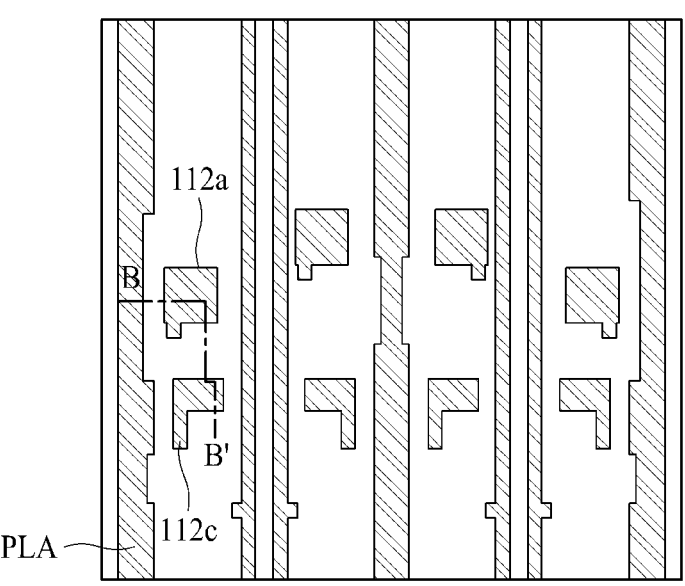
FIGS. 9A to 9H are exemplary views illustrating a method of manufacturing pixels shown in FIG. 7, according to an embodiment of the present disclosure.
Figure 10A:
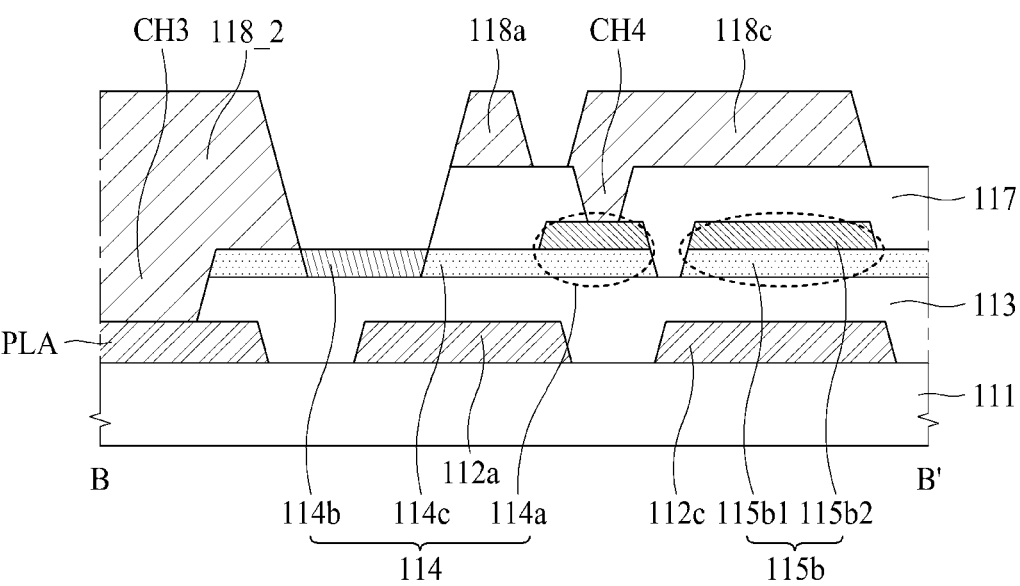
FIG. 10A is an exemplary view illustrating a cross-section taken along line B-B' shown in FIGS. 7 and 8, according to an embodiment of the present disclosure.
Figure 10B:
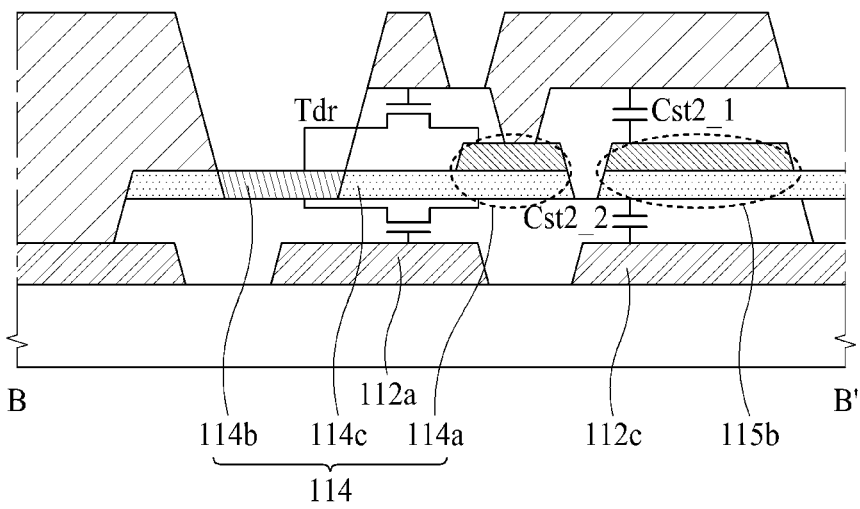
FIG. 10B is an exemplary view illustrating transistors and capacitors in the cross-section shown in FIG. 10A, according to an embodiment of the present disclosure.

First of all, as shown in FIG. 9A, a light shielding layer is provided on an upper surface of a substrate 111.

The light shielding layer may include a light shielding electrode 112a, a second light shielding capacitor electrode 112c, a first voltage supply line PLA and other various electrodes.

Next, the light shielding layer is covered by a buffer 113.

Figure 9B:
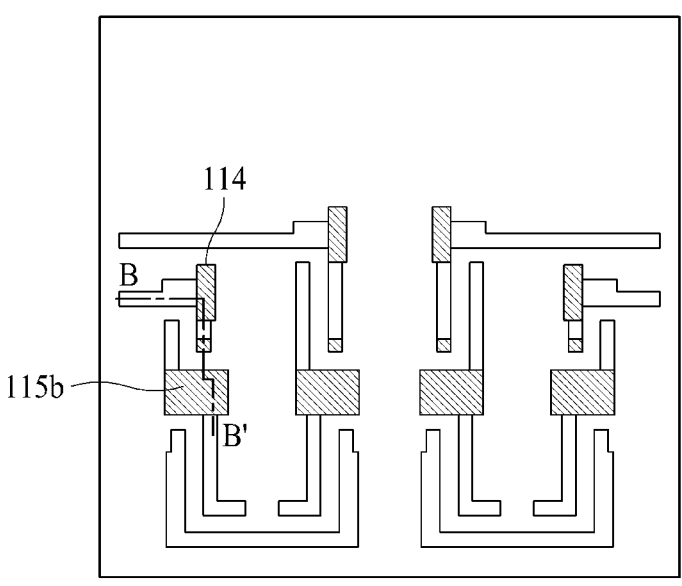

Next, an active layer, as shown in FIG. 9B, is provided on an upper surface of the buffer 113.

The active layer may include an active portion 114, a second active capacitor electrode 115b and other various electrodes.

Figure 9C:
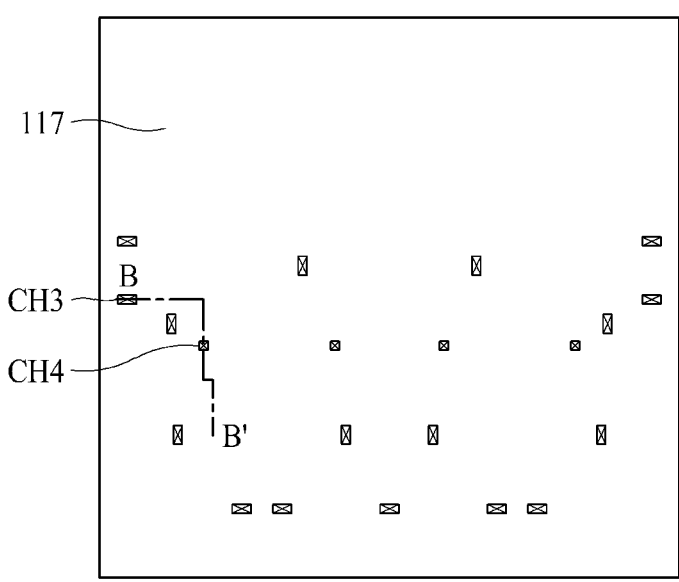

Next, the active layer is covered by a gate insulating layer 117 as shown in FIG. 9C.

In this case, a first contact hole CH1, a second contact hole CH2 and other various contact holes are formed in the gate insulating layer 117.

Figure 9D:
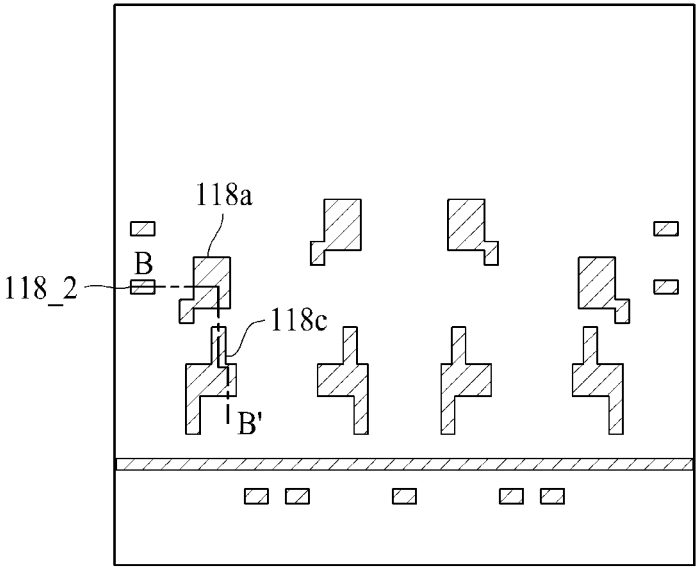

Next, a gate layer, as shown in FIG. 9D, is provided on an upper surface of the gate insulating layer 117.

The gate layer may include a gate electrode 118a, a second gate capacitor electrode 118c, a third contact hole electrode 118_2 and other various electrodes.

Next, the gate layer is covered by a planarization layer.

Figure 9E:
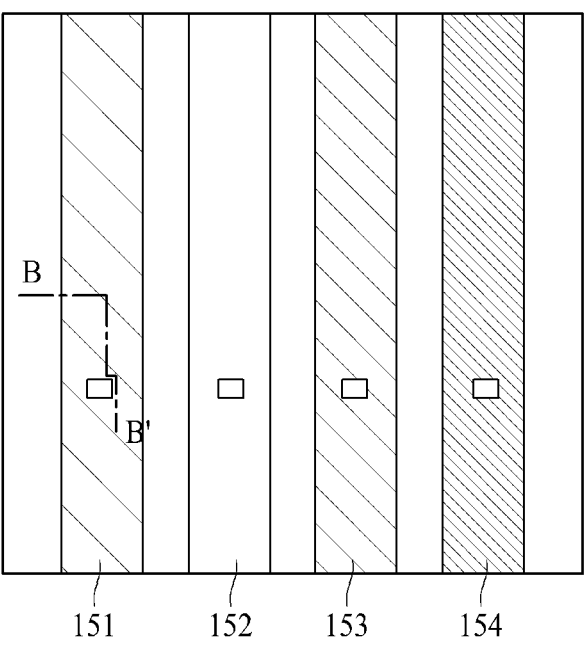

Next, a color filter layer, as shown in FIG. 9E, is provided on an upper surface of the planarization layer.

For example, the color filter layer may include a red color filter 151, a blue color filter 152, a white color filter 153 and a green color filter 154.

Figure 9F:
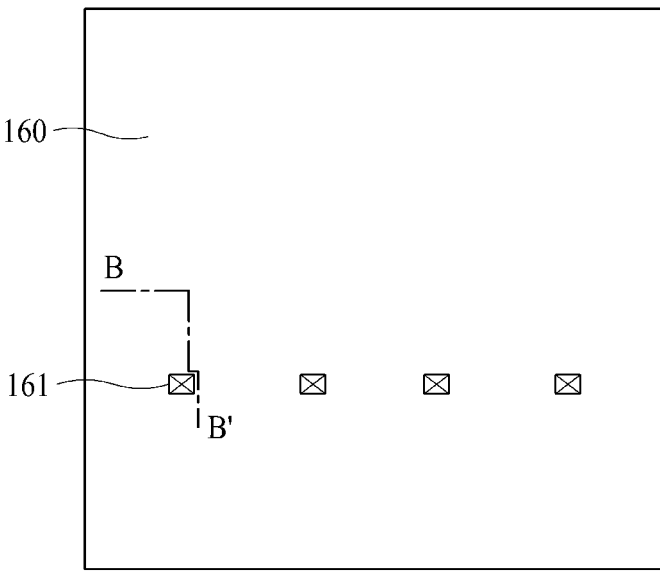

Next, the color filter layer is covered by an overcoating layer 160 as shown in FIG. 9F.

In this case, a pixel contact hole 161 for connecting a first electrode 114a of a driving transistor Tdr with an anode electrode may be formed in the overcoating layer 160. The pixel contact hole 161 may pass through the planarization layer and the gate insulating layer 117.

Figure 9G:
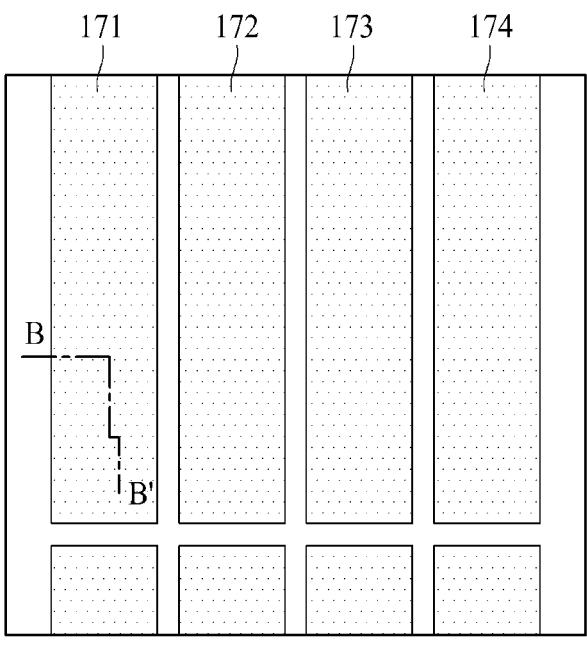

Next, an anode electrode layer, as shown in FIG. 9G, is provided on an upper surface of the overcoating layer 160.

The anode electrode layer may include a red anode electrode 171 provided in a red pixel, a blue anode electrode 172 provided in a blue pixel, a white anode electrode 173 provided in a white pixel and a green anode electrode 174 provided in a green pixel.

Figure 9H:
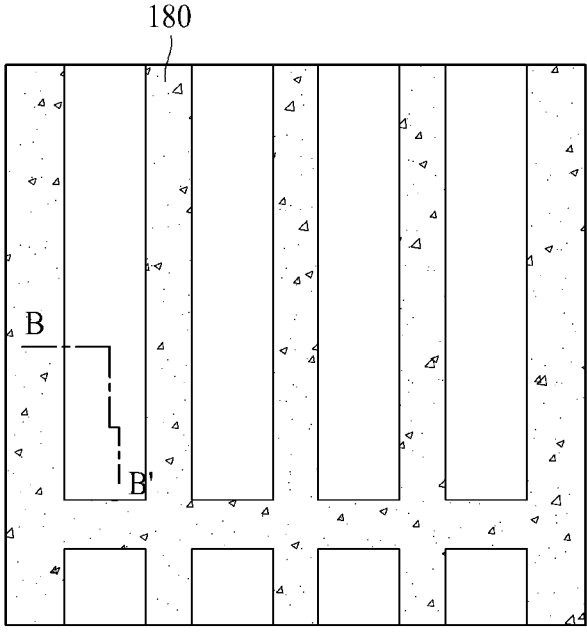

Next, a bank 180 as shown in FIG. 9H is provided on an upper surface of the anode electrode layer.

The bank 180 is formed to surround an outer periphery of the anode electrodes 171 to 174 constituting the anode electrode layer. Therefore, the anode electrodes 171 to 174 are exposed through an area in which the bank 180 is not provided.

Next, a light emitting layer is provided on an upper surface of the anode electrodes 171 to 174.

Next, a cathode electrode is provided in a display area of the substrate to cover the light emitting layer.

Finally, the cathode electrode is covered by an encapsulation layer.

Features of the light emitting display panel according to the present disclosure, which is manufactured through the above-described manufacturing process, will be described below.

The driving transistor Tdr, as shown in FIG. 10A, includes a light shielding electrode 112a used as a gate of the driving transistor and provided in the substrate 111, a buffer 113 covering the light shielding electrode 112a, an active portion 114 provided on an upper surface of the buffer 113, forming a first electrode 114a, a second electrode 114b and a semiconductor portion 114c of the driving transistor Tdr, a gate insulating layer 117 covering the active portion 114, and a gate electrode 118a provided on an upper surface of the gate insulating layer 117, connected with the light shielding electrode 112a and used as the gate of the driving transistor Tdr.

The storage capacitor Cst includes a second active capacitor electrode 115b spaced apart from the active portion 114, a second gate capacitor electrode 118c connected with the first electrode 114a of the driving transistor, provided on the upper surface of the gate insulating layer 117 and overlapped with the second active capacitor electrode 115b, and a second light shielding capacitor electrode 112c spaced apart from the light shielding electrode 112a and overlapped with the second active capacitor electrode 115b.

The first electrode 114a of the driving transistor Tdr and the second active capacitor electrode 115b are spaced apart from each other and formed in the same shape as shown in FIGS. 10A and 10B.

The gate electrode 118a that forms the gate of the driving transistor Tdr and the second gate capacitor electrode 118c that forms the storage capacitor Cst are spaced apart from each other and formed in the same layer.

The second active capacitor electrode 115b includes a first reference electrode 115b1 spaced apart from the semiconductor portion 114c of the active portion 114 and a second reference electrode 115b2 provided on an upper surface of the first reference electrode 115b1. The first electrode 114a may be formed of a double structure of the same material as that of the first reference electrode 115b1 and the same material as that of the second reference electrode 115b2.

The first reference electrode 115b1 may be formed of the same material as that of the semiconductor portion 114c. For example, the first reference electrode 115b1 may be an IGZO comprised of indium, gallium, zinc and oxygen.

The second reference electrode 115b2 may be formed of a metal material. For example, the second reference electrode 115b2 may be an alloy (MoTi) comprised of molybdenum and titanium.

The second gate capacitor electrode 118c and the first electrode 114a are connected to each other through a fourth contact hole CH4 in the gate insulating layer 117.

The second active capacitor electrode 115b is connected with the light shielding electrode 112a or the gate electrode 118a, and the second light shielding capacitor electrode 112c is connected with the second gate capacitor electrode 118c.

The storage capacitor Cst includes at least three electrodes provided in their respective layers different from one another.

For example, as shown in FIG. 10B, the storage capacitor Cst includes a (2-1)th capacitor Cst2_1 comprised of a second active capacitor electrode 115b and a second gate capacitor electrode 118c on a same layer and of a same material as the gate electrode 118a of the driving transistor Tdr. The second active capacitor electrode 115b is spaced apart from the active portion 114 by the gate insulating layer 117. The storage capacitor Cst also includes a (2-2)th capacitor Cst2_2 comprised of a second active capacitor electrode 115b and the second light shielding capacitor electrode 112c.

According to the present disclosure described as above, the light shielding electrode 112a and the gate electrode 118a, which are provided in their respective layers different from each other, are used as the gate of the driving transistor Tdr. That is, the semiconductor portion 114c of the driving transistor Tdr applied to the present disclosure may be driven by the light shielding electrode 112a and the gate electrode 118a.

Therefore, the driving transistor Tdr applied to the present disclosure includes only one of the light shielding electrode 112a and the gate electrode 118a, which are used as the gate of the driving transistor Tdr, and may have the same or similar performance as or to that of a conventional driving transistor having a size larger than that of the driving transistor applied to the present disclosure.

Therefore, the driving transistor applied to the present disclosure may have the same or similar performance as or to that of the conventional driving transistor even though the driving transistor applied to the present disclosure is formed to have a small size compared to the conventional driving transistor. Therefore, according to the present disclosure, the size of electrodes constituting the driving transistor Tdr may be reduced, whereby an aperture ratio of the light emitting display panel may be increased.

According to the present disclosure described as above, the storage capacitor Cst includes a (2-1)th capacitor Cst2_1 and a (2-2)th capacitor Cst2_2, which are connected in parallel. Therefore, when compared to the conventional storage capacitor formed by two electrodes facing each other, the storage capacitor Cst applied to the present disclosure may form the same or similar capacitance as or to that of the conventional capacitor at a size smaller than that of the conventional capacitor. Therefore, a size of an opening may be increased as much as a reduced size of the storage capacitor.

In addition, the (2-1)th capacitor Cst2_1 includes a second active capacitor electrode 115b and a second gate capacitor electrode 118c, and the (2-2)th capacitor Cst2_2 includes a second active capacitor electrode 115b and a second light shielding capacitor electrode 112c.

In this case, the gate electrode 118a, the second active capacitor electrode 115b and the light shielding electrode 112a are electrically connected with one another, and the first electrode 114a, the second gate capacitor electrode 118c and the second light shielding capacitor electrode 112c are electrically connected with one another.

Therefore, first terminals of the (2-1)th capacitor Cst2_1 and the (2-2)th capacitor Cst2_2 are commonly connected to the first electrode 114a, and second terminals thereof are commonly connected to the gate electrode 118a.

That is, the (2-1)th capacitor Cst2_1 and the (2-2)th capacitor Cst2_2 are connected with each other in parallel, and thus the capacitance of the storage capacitor Cst including the (2-1)th capacitor Cst2_1 and the (2-2)th capacitor Cst2_2 may be larger than the capacitance of the storage capacitor having only one of the (2-1)th capacitor Cst2_1 and the (2-2)th capacitor Cst2_2.

Therefore, the storage capacitor Cst applied to the present disclosure may form the same or similar capacitance as or to that of the conventional capacitor at a size smaller than that of the conventional capacitor, as or to that of the conventional capacitor at a size smaller than that of the conventional capacitor. and thus the size of the opening of the light emitting display panel 100 may be increased as much as the reduced size of the storage capacitor.

Figure 11:
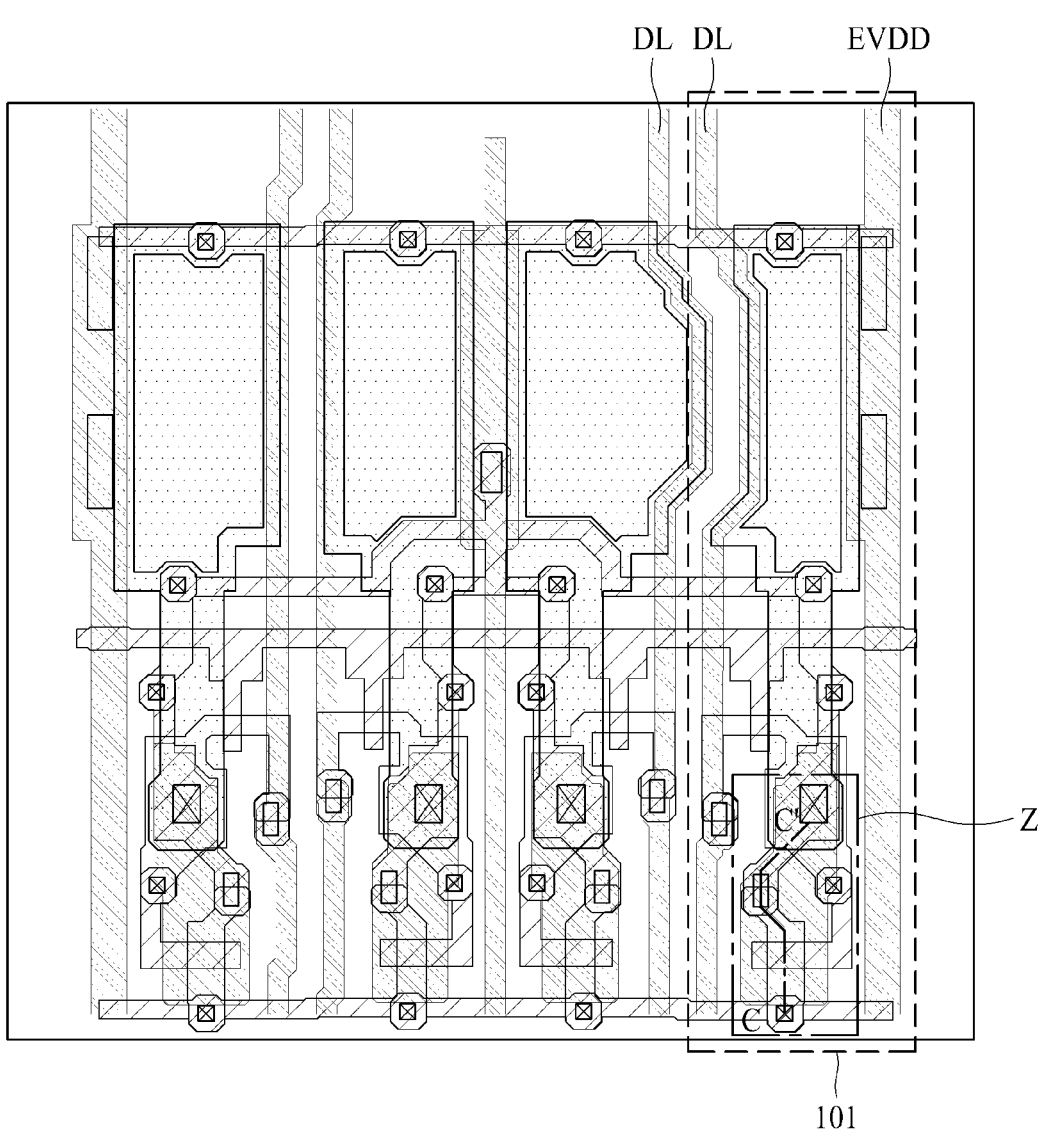
FIG. 11 is other exemplary view illustrating four pixels of a light emitting display panel, according to an embodiment of the present disclosure.
Figure 12:
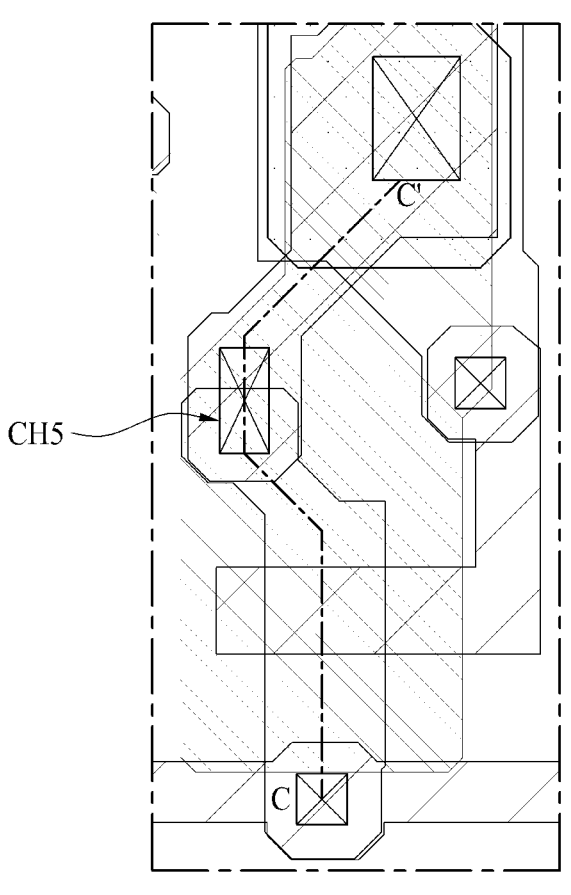
FIG. 12 is an enlarged exemplary view illustrating an area Z shown in FIG. 11, according to an embodiment of the present disclosure.

FIG. 11 is other exemplary view illustrating four pixels of a light emitting display panel according to an embodiment of the present disclosure. FIG. 12 is an enlarged exemplary view illustrating an area Z shown in FIG. 11, according to an embodiment of the present disclosure. FIGS. 13A to 13H are exemplary views illustrating a method of manufacturing pixels shown in FIG. 11, according to an embodiment of the present disclosure. FIG. 14A is an exemplary view illustrating a cross-section taken along line C-C' shown in FIGS. 11 and 12, according to an embodiment of the present disclosure. FIG. 14B is an exemplary view illustrating transistors and capacitors in the cross-section shown in FIG. 14A. In the following description, the same or similar description as or to that described with reference to FIGS. 1 to 10B will be omitted or briefly described.

A method of manufacturing other light emitting display panel according to the present disclosure will be described with reference to FIGS. 11 to 14B.

Figure 13A:
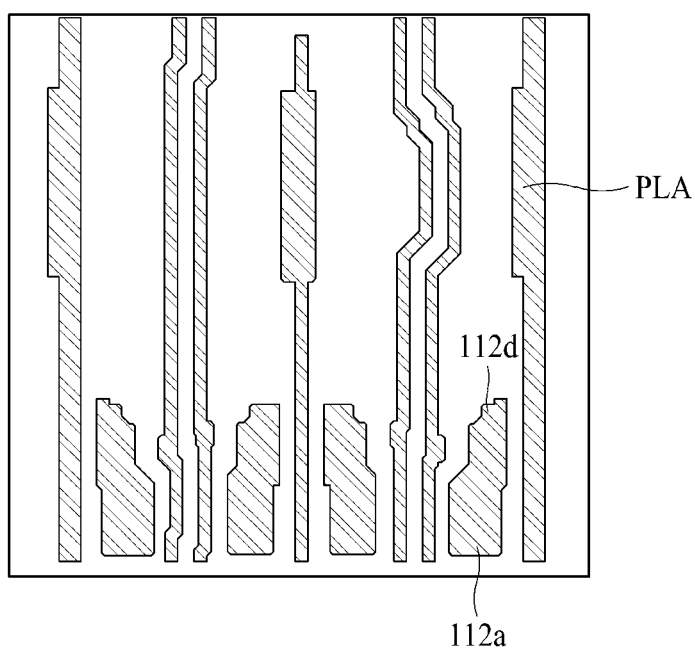
FIGS. 13A to 13H are exemplary views illustrating a method of manufacturing pixels shown in FIG. 11, according to an embodiment of the present disclosure.
Figure 14A:
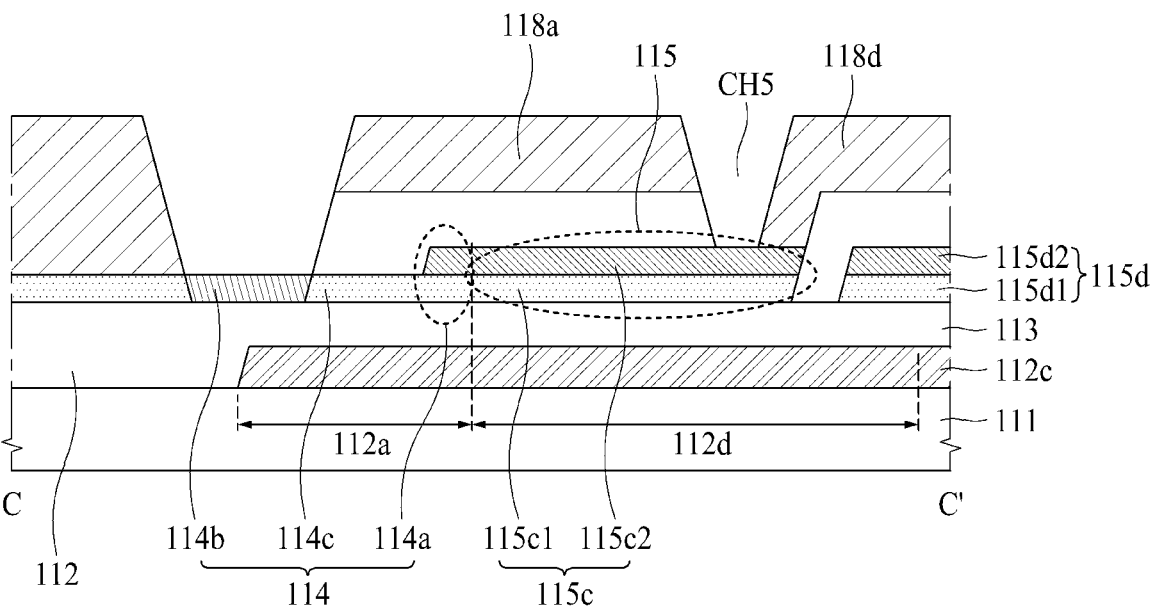
FIG. 14A is an exemplary view illustrating a cross-section taken along line C-C' shown in FIGS. 11 and 12, according to an embodiment of the present disclosure.
Figure 14B:
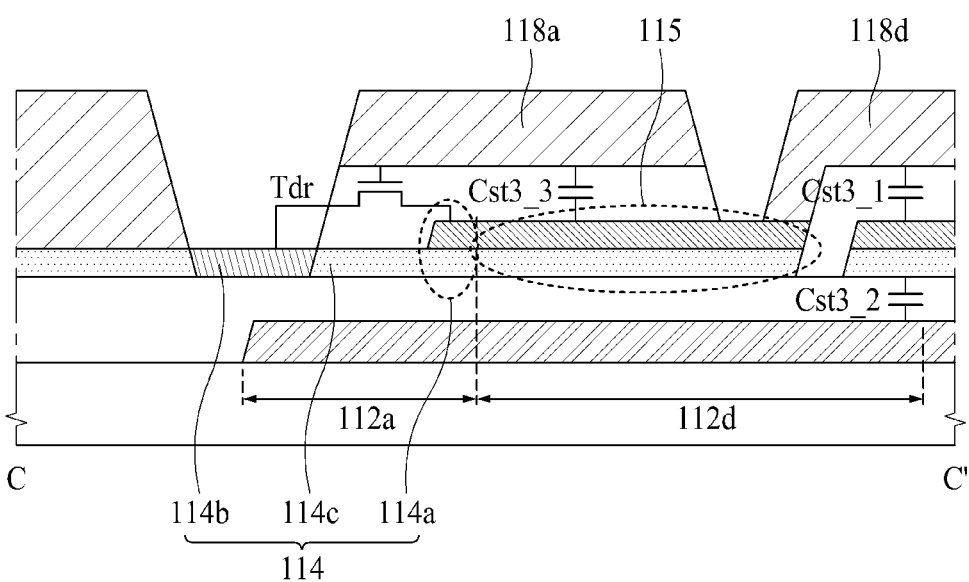
FIG. 14B is an exemplary view illustrating transistors and capacitors in the cross-section shown in FIG. 14A, according to an embodiment of the present disclosure.

First of all, as shown in FIG. 13A, a light shielding layer is provided on an upper surface of a substrate 111.

The light shielding layer may include a light shielding electrode 112a, a third light shielding capacitor electrode 112d, a first voltage supply line PLA and other various electrodes.

Next, the light shielding layer is covered by a buffer 113.

Figure 13B:
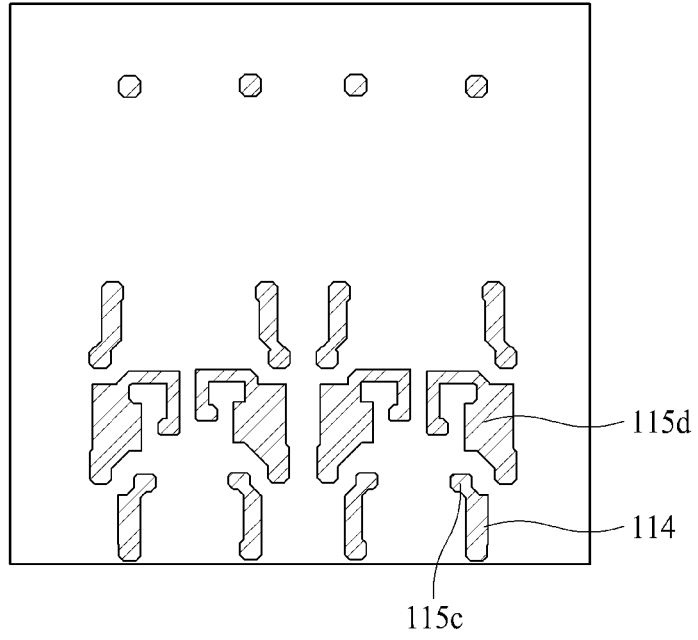

Next, an active layer, as shown in FIG. 13B, is provided on an upper surface of the buffer 113.

The active layer may include an active portion 114, a third active capacitor electrode 115c, a fourth active capacitor electrode 115d and other various electrodes.

Figure 13C:
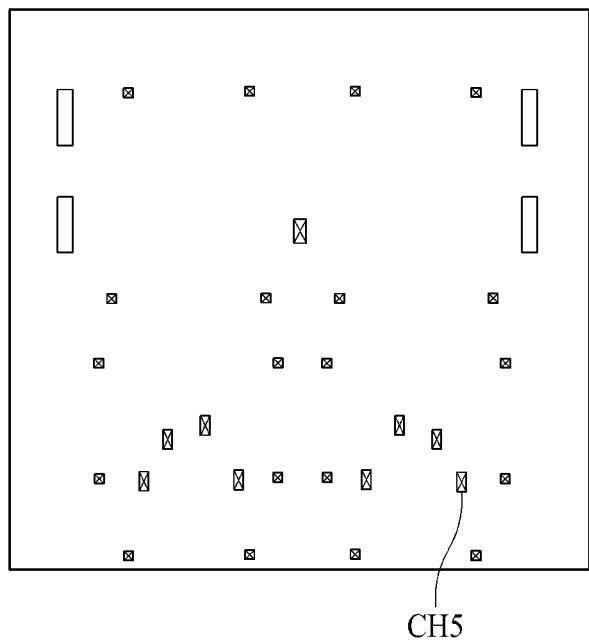

Next, the active layer is covered by a gate insulating layer 117 as shown in FIG. 13C.

In this case, a fifth contact hole CH5 and other various contact holes are formed in the gate insulating layer 117.

Figure 13D:
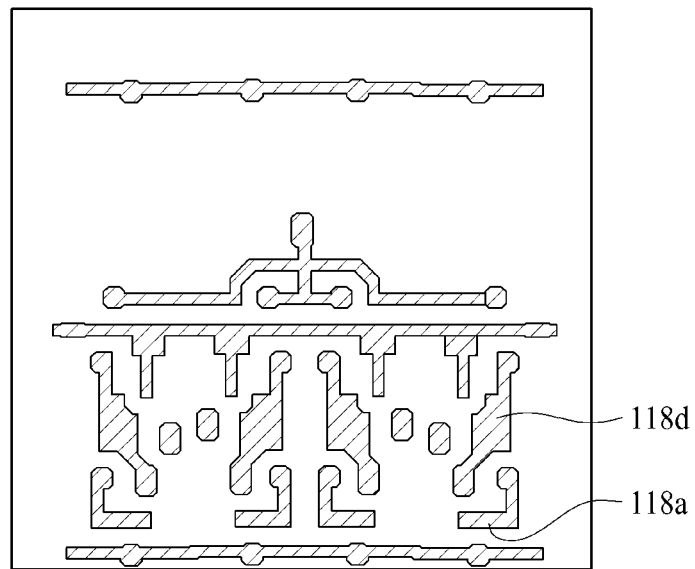

Next, a gate layer, as shown in FIG. 13D, is provided on an upper surface of the gate insulating layer 117.

The gate layer may include a gate electrode 118a, a third gate capacitor electrode 118d and other various electrodes.

Next, the gate layer is covered by a planarization layer.

Figure 13E:
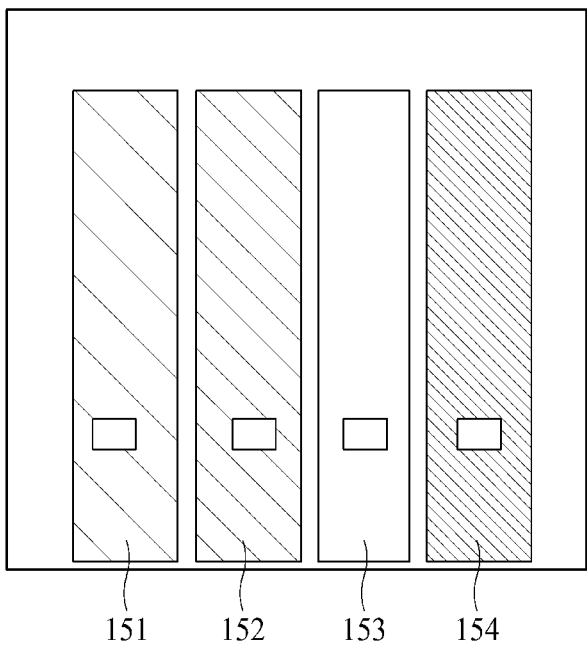

Next, a color filter layer, as shown in FIG. 13E, is provided on an upper surface of the planarization layer.

For example, the color filter layer may include a red color filter 151, a blue color filter 152, a white color filter 153 and a green color filter 154.

Figure 13F:
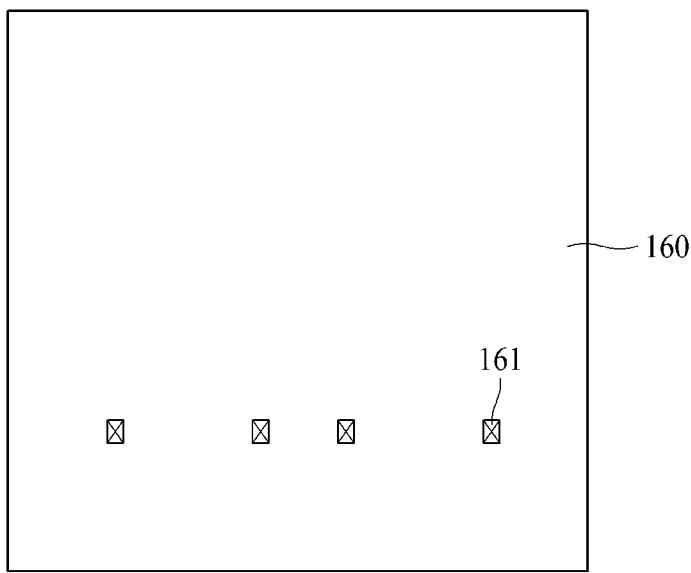

Next, the color filter layer is covered by an overcoating layer 160 as shown in FIG. 13F.

In this case, a pixel contact hole 161 for connecting a first electrode 114a of a driving transistor Tdr with an anode electrode may be formed in the overcoating layer 160. The pixel contact hole 161 may pass through the planarization layer and the gate insulating layer 117.

Figure 13G:
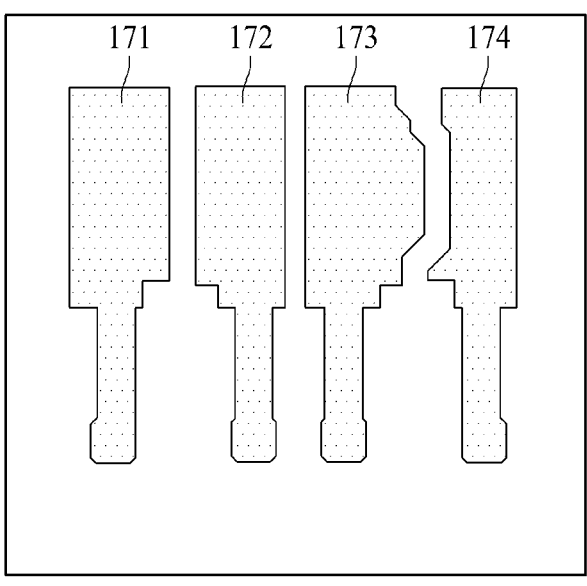

Next, an anode electrode layer, as shown in FIG. 13G, is provided on an upper surface of the overcoating layer 160.

The anode electrode layer may include a red anode electrode 171 provided in a red pixel, a blue anode electrode 172 provided in a blue pixel, a white anode electrode 173 provided in a white pixel and a green anode electrode 174 provided in a green pixel.

Figure 13H:
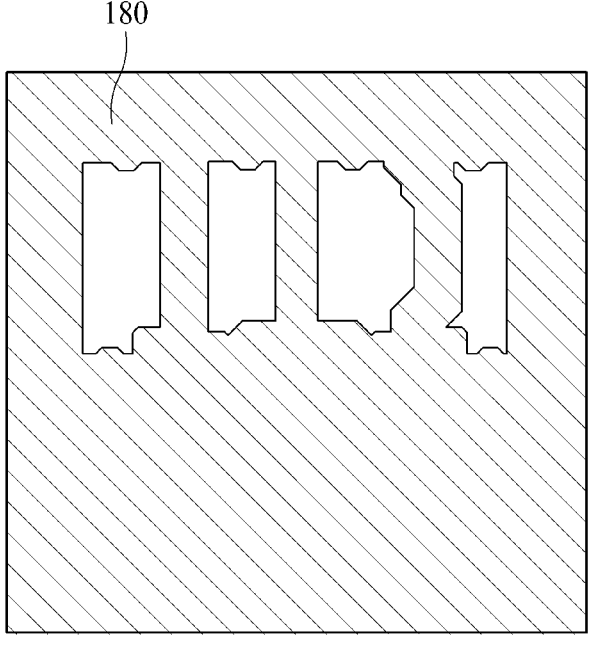

Next, a bank 180 as shown in FIG. 13H is provided on an upper surface of the anode electrode layer.

The bank 180 is formed to surround an outer periphery of the anode electrodes 171 to 174 constituting the anode electrode layer. Therefore, the anode electrodes 171 to 174 are exposed through an area in which the bank 180 is not provided.

Next, a light emitting layer is provided on an upper surface of the anode electrodes 171 to 174.

Next, a cathode electrode is provided in a display area of the substrate to cover the light emitting layer.

Finally, the cathode electrode is covered by an encapsulation layer.

Features of the light emitting display panel according to the present disclosure, which is manufactured through the above-described manufacturing process, will be described below.

The light emitting display panel 100 includes a light emitting element ED provided in a pixel, a driving transistor Tdr connected with the light emitting element ED, and a storage capacitor Cst provided between the gate of the driving transistor Tdr and the first electrode 114a, and the storage capacitor Cst includes at least three electrodes provided in their respective layers different from one another.

The driving transistor Tdr includes a buffer 113 provided on the substrate 111, an active portion 114 provided on an upper surface of the buffer 113, forming a first electrode 114a, a second electrode 114b and a semiconductor portion 114c of the driving transistor Tdr, a gate insulating layer 117 covering the active portion 114, and a gate electrode 118a provided on an upper surface of the gate insulating layer 117 and used as the gate of the driving transistor Tdr.

The storage capacitor Cst includes a third gate capacitor electrode 118d, a fourth active capacitor electrode 115d and a third light shielding capacitor electrode 112d.

The third gate capacitor electrode 118d is connected with the third active capacitor electrode 115c including a first reference electrode 115c1 extended from the semiconductor portion 114c constituting the driving transistor Tdr and a second reference electrode 115c2 provided on an upper surface of the first reference electrode 115c1. The third gate capacitor electrode 118d is provided in the same layer as the gate electrode 118a constituting the driving transistor.

The fourth active capacitor electrode 115d is formed of the same material as that of the third active capacitor electrode 115c in the same layer as the third active capacitor electrode 115c, is separated from the third active capacitor electrode 115c, is connected with the gate electrode 118a of the driving transistor Tdr, and is overlapped with the third gate capacitor electrode 118d.

The third light shielding capacitor electrode 112d is extended from the light shielding electrode 112a provided on the lower surface of the driving transistor Tdr and overlapped with the fourth active capacitor electrode 115d.

The first electrode 114a of the driving transistor Tdr and the third active capacitor electrode 115c are integrally formed. That is, as shown in FIGS. 14A and 14B, the first electrode 114a and the third active capacitor electrode 115c are continuously formed, and are formed of the same material.

The first electrode 114a of the driving transistor Tdr and the fourth active capacitor electrode 115d are spaced apart from each other and formed in the same shape, as shown in FIGS. 14A and 14B.

The gate electrode 118a that forms the gate of the driving transistor Tdr and the third gate capacitor electrode 118d that forms the storage capacitor Cst are spaced apart from each other and formed in the same layer.

The fourth active capacitor electrode 115d includes a first reference electrode 115d1 spaced apart from the semiconductor portion 114c of the active portion 114 and a second reference electrode 115d2 provided on an upper surface of the first reference electrode 115d1. The first electrode 114a and the third active capacitor electrode 115c may be formed of a double structure of the same material as that of the first reference electrode 115d1 and the same material as that of the second reference electrode 115d2.

The first reference electrode 115d1 may be formed of the same material as that of the semiconductor portion 114c. For example, the first reference electrode 115d1 may be an IGZO comprised of indium, gallium, zinc and oxygen.

The second reference electrode 115d2 may be formed of a metal material. For example, the second reference electrode 115d2 may be an alloy (MoTi) comprised of molybdenum and titanium.

The third gate capacitor electrode 118d and the third active capacitor electrode 115c are connected to each other through the fifth contact hole CH5.

The third light shielding capacitor electrode 112d is connected with the third gate capacitor electrode 118d.

The storage capacitor Cst includes at least three electrodes provided in their respective layers different from one another.

For example, the storage capacitor Cst includes a (3-1)th capacitor Cst3_1 comprised of a fourth active capacitor electrode 115d spaced apart from the third active capacitor electrode 115c by the gate insulating layer 117 and a third gate capacitor electrode 118d on the gate insulating layer 117. The storage capacitor Cst also includes a (3-2)th capacitor Cst3_2 comprised of the fourth active capacitor electrode 115d and a third light shielding capacitor electrode 112d, and may further include a (3-3)th capacitor Cst3_3 comprised of a gate electrode 118a used as a gate of the driving transistor Tdr and a third active capacitor electrode 115c that extends from the first electrode 114a of the driving transistor Tdr.

According to the present disclosure described as above, the storage capacitor Cst includes a (3-1)th capacitor Cst3_1, a (3-2)th capacitor Cst3_2 and a (3-3)th capacitor Cst3_3, which are connected in parallel. Therefore, when compared to the conventional storage capacitor formed by two electrodes facing each other, the storage capacitor Cst applied to the present disclosure may form the same or similar capacitance as or to that of the conventional capacitor at a size smaller than that of the conventional capacitor. Therefore, a size of an opening may be increased as much as a reduced size of the storage capacitor.

In addition, the (3-1)th capacitor Cst3_1 includes a fourth active capacitor electrode 115d and a third gate capacitor electrode 118d, the (3-2)th capacitor Cst3_2 includes a fourth active capacitor electrode 115d and a third light shielding capacitor electrode 112d, and the (3-3)th capacitor Cst3_3 includes a gate electrode 118a and a third active capacitor electrode 115c.

In this case, the gate electrode 118a and the fourth gate capacitor electrode 115d are electrically connected with each other, and the first electrode 114a, the third gate capacitor electrode 118d and the third light shielding capacitor electrode 112d are electrically connected with one another.

Therefore, first terminals of the (3-1)th capacitor Cst3_1, the (3-2)th capacitor Cst3_2 and the (3-3)th capacitor Cst3_3 are commonly connected to the first electrode 114a, and second terminals thereof are commonly connected to the gate electrode 118a.

That is, the (3-1)th capacitor Cst3_1, the (3-2)th capacitor Cst3_2 and the (3-3)th capacitor Cst3_3 are connected with one another in parallel, and thus capacitance of the storage capacitor Cst including the (3-1)th capacitor Cst3_1, the (3-2)th capacitor Cst3_2 and the (3-3)th capacitor Cst3_3 may be larger than that of the storage capacitor having only one of the (3-1)th capacitor Cst3_1, the (3-2)th capacitor Cst3_2 and the (3-3)th capacitor Cst3_3.

Therefore, the storage capacitor Cst applied to the present disclosure may form the same or similar capacitance as or to that of the conventional capacitor at a size smaller than that of the conventional capacitor, and thus the size of the opening of the light emitting display panel 100 may be increased as much as the reduced size of the storage capacitor.

According to the present disclosure, the following advantageous effects may be obtained. According to the present disclosure, since the driving transistor may be formed in the form of a dual gate, its size may be reduced. Therefore, the size of the opening may be increased as much as the reduced size of the driving transistor.

According to the present disclosure, the storage capacitor may be formed using at least three electrodes. Therefore, when compared to the conventional storage capacitor formed by two electrodes facing each other, the storage capacitor according to the present disclosure may form the same or similar capacitance as or to that of the conventional storage capacitor. Therefore, the size of the opening may be increased as much as the reduced size of the storage capacitor.

That is, according to the present disclosure, the size of at least one of the driving transistor or the storage capacitor may be reduced, and thus the size of the opening may be increased. Therefore, an aperture ratio may be improved.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display panel comprising:
a light emitting element provided in a pixel;
a driving transistor connected to the light emitting element; and
a storage capacitor connected to a gate and a first electrode of the driving transistor,
wherein the driving transistor includes:
a light shielding electrode provided on a substrate and used as the gate of the driving transistor;
a buffer covering the light shielding electrode;
an active portion provided on an upper surface of the buffer,
a gate insulating layer covering at least a portion of the active portion; and a gate electrode provided on and contacting an upper surface of the gate insulating layer, connected with the light shielding electrode and used as the gate of the driving transistor, wherein an electrode of the storage capacitor is connected to at least one of the light shielding electrode and the gate electrode, wherein the storage capacitor includes:

a first active capacitor electrode extending from the first electrode of the active portion of the driving transistor;

a first gate capacitor electrode extending from and contacting the gate electrode, wherein the first gate capacitor electrode overlaps at least a portion of the first active capacitor electrode with the gate insulating layer therebetween; and a first light shielding capacitor electrode extending from the light shielding electrode, wherein the active portion includes the first electrode, a second electrode, and a semiconductor portion of the driving transistor, wherein the semiconductor portion includes a semiconductor layer formed of a semiconductor, wherein the first electrode includes a first layer extending from the semiconductor layer;

and a second layer on the first layer, the second layer being formed of a metal, wherein the first active capacitor electrode includes a first reference electrode extending from the first layer; and a second reference electrode provided on an upper surface of the first reference electrode, the second reference electrode being extending from the second layer, wherein the light shielding electrode under the semiconductor portion and the first electrode overlaps the semiconductor portion and the first electrode, wherein the first light shielding capacitor electrode is provided on the same layer as the light shielding electrode, wherein the first light shielding capacitor electrode is provided under the first active capacitor electrode, which includes the first reference electrode and the second reference, and at least a portion of the first active capacitor electrode overlaps the first light shielding capacitor electrode with the buffer therebetween, and wherein the first light shielding capacitor electrode is provided under the first gate capacitor electrode and the first active capacitor electrode, which is provided under the first gate capacitor electrode, and at least a portion of the first gate capacitor electrode overlaps the first light shielding capacitor electrode with the first active capacitor electrode therebetween.

2. The light emitting display panel of claim 1, wherein the storage capacitor includes three electrodes provided in their respective layers different from one another.

3. The light emitting display panel of claim 1, wherein the first gate capacitor electrode and the first light shielding capacitor electrode are connected to each other through a contact hole passing through the gate insulating layer and the buffer.

4. The light emitting display panel of claim 1, wherein the storage capacitor includes:

a (1-1) th capacitor comprised of the first active capacitor electrode and the first gate capacitor electrode; and a (1-2) th capacitor comprised of the first active capacitor electrode and the first light shielding capacitor electrode.

5. The light emitting display panel of claim 1, wherein the storage capacitor includes:

a second active capacitor electrode provided on the upper surface of the buffer, wherein the second active capacitor electrode is spaced apart from the active portion;

a second gate capacitor electrode provided on the upper surface of the gate insulating layer and overlapped with the second active capacitor electrode, wherein the second gate capacitor electrode is connected to the first electrode of the driving transistor through a contact hole in the gate insulating layer; and a second light shielding capacitor electrode provided on the substrate, wherein the second light shielding capacitor is spaced apart from the light shielding electrode and overlapped with the second active capacitor electrode.

6. The light emitting display panel of claim 5, wherein the second active capacitor electrode includes:

a first reference electrode spaced apart from the semiconductor portion of the active portion, the first reference electrode having a same material as the semiconductor portion of the active portion; and a second reference electrode provided on an upper surface of the first reference electrode.

7. The light emitting display panel of claim 5, wherein the second active capacitor electrode is connected to at least one of the light shielding electrode and the gate electrode, and the second light shielding capacitor electrode is connected to the second gate capacitor electrode.

8. The light emitting display panel of claim 5, wherein the storage capacitor includes:

a (2-1) th capacitor comprised of the second active capacitor electrode and the second gate capacitor electrode; and a (2-2) th capacitor comprised of the second active capacitor electrode and the second light shielding capacitor electrode.

9. A light emitting display panel comprising:

a light emitting element;

a driving transistor configured to drive the light emitting element, the driving transistor comprising:

an active portion including a first electrode, a second electrode, and a semiconductor portion, a gate insulating layer on at least a portion of the active portion, and a gate electrode disposed on at least a portion of the gate insulating layer;

a light shielding electrode on a substrate; and a storage capacitor electrically connected to the driving transistor, wherein the storage capacitor includes:

a first active capacitor electrode extending from the first electrode of the active portion of the driving transistor;

a first gate capacitor electrode extending from and contacting the gate electrode, wherein the first gate capacitor electrode overlaps at least a portion of the first active capacitor electrode with the gate insulating layer therebetween; and a first light shielding capacitor electrode extending from the light shielding electrode, wherein the semiconductor portion includes a semiconductor layer formed of a semiconductor, wherein the first electrode includes a first layer extending from the semiconductor layer;

and a second layer on the first layer, the second layer being formed of a metal, wherein the first active capacitor electrode includes a first reference electrode extending from the first layer; and a second reference electrode provided on an upper surface of the first reference electrode, the second reference electrode being extending from the second layer, wherein the light shielding electrode under the semiconductor portion and the first electrode overlaps the semiconductor portion and the first electrode, wherein the first light shielding capacitor electrode is provided on the same layer as the light shielding electrode, wherein the first light shielding capacitor electrode is provided under the first active capacitor electrode, which includes the first reference electrode and the second reference, and at least a portion of the first active capacitor electrode overlaps the first light shielding capacitor electrode with buffer therebetween, and wherein the first light shielding capacitor electrode is provided under the first gate capacitor electrode and the first active capacitor electrode, which is provided under the first gate capacitor electrode, and at least a portion of the first gate capacitor electrode overlaps the first light shielding capacitor electrode with the first active capacitor electrode therebetween.

10. The light emitting display panel of claim 9, wherein the storage capacitor includes three electrodes provided in their respective layers different from one another.

11. The light emitting display panel of claim 9, wherein the first light shielding capacitor electrode extends from the light shielding electrode to overlap with the first active capacitor electrode to form a first capacitor and the first active capacitor electrode includes a first layer that extends from the semiconductor portion of the active portion and a second layer provided on an upper surface of the first layer.

12. The light emitting display panel of claim 10, wherein the first gate capacitor electrode and the first light shielding capacitor electrode are connected to each other through a contact hole passing through the gate insulating layer and the buffer.

* * * * *